US006259755B1

(12) United States Patent
O'Sullivan et al.

(10) Patent No.: US 6,259,755 B1
(45) Date of Patent: Jul. 10, 2001

(54) DATA CLOCK RECOVERY PLL CIRCUIT USING A WINDOWED PHASE COMPARATOR

(75) Inventors: Eugene O'Sullivan; Akihito Shimoda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/050,598

(22) Filed: Mar. 30, 1998

(30) Foreign Application Priority Data

Mar. 31, 1997 (JP) ...................................... 9-081521

(51) Int. Cl.[7] ................ H03D 3/24; H04J 3/06; G06F 1/04
(52) U.S. Cl. ................ 375/376; 370/503; 395/558
(58) Field of Search .................... 375/357, 371, 375/372, 373, 374, 375, 376, 294; 370/503; 329/307, 325, 360; 395/558

(56) References Cited

U.S. PATENT DOCUMENTS

| 5,097,489 | 3/1992 | Tucci . | |
|---|---|---|---|
| 5,212,601 | * 5/1993 | Wilson | 360/51 |
| 5,374,860 | * 12/1994 | Llewellyn | 327/276 |
| 5,446,867 | 8/1995 | Young et al. . | |
| 5,557,648 | 9/1996 | Ishihara . | |
| 5,900,784 | * 5/1999 | O'Sullivan | 331/2 |
| 5,986,485 | * 11/1999 | O'Sullivan | 327/156 |

OTHER PUBLICATIONS

W.D. Llewellyn, M.M.H. Wong, G.W. Tietz, P.A. Tucci, "High–Speed Data Recovery", *IEEE International Solid-State Circuits Conference*, 1998.

* cited by examiner

Primary Examiner—Stephen Chin
Assistant Examiner—Albert Park
(74) *Attorney, Agent, or Firm*—Hutchins, Wheeler & Dittmar

(57) ABSTRACT

A data and clock recovery phase locked loop circuit comprises a data transition detector block to detect transitions of random input data and to produce a window signal. A delay block delays the random input data to produce delayed random input data. A phase comparator block is connected to the delay block and compares phase of the delayed random input data with phase of a feedback signal to produce a phase compared signal. A charge pump block is connected to the phase comparator block and produces output voltage in response to the phase compared signal. A filter block is connected to the charge pump block to filter the output voltage into DC voltage. A voltage controlled oscillator is connected to the filter block to generate the clock signal which has a frequency depending on the DC voltage. A multiplexer block is connected to the voltage controlled oscillator, the data transition detector block, and the phase comparator block and selects one from a predetermined logical level and the clock signal to supply a selected signal to the phase comparator block as the feedback signal.

20 Claims, 18 Drawing Sheets

DATA CLOCK RECOVERY PLL CIRCUIT USING A WINDOWED PHASE COMPARATOR

BACKGROUND OF THE INVENTION

This invention relates to a data and clock recovery PLL (phase locked loop) circuit which uses a Windowed Phase Comparator to extract a clock signal from its random input data in a data transmission system, or the like.

Phase locked loop circuits are very important components in data transmission systems. They are used in many different applications for example to eliminate skew between communication chips to recover a clock signal from random input data.

A conventional phase locked loop circuit includes a Gilbert Multiplier type phase detector and an emitter-coupled multivibrator VCO (voltage controlled oscillator). The conventional phase locked loop circuit can maintain stable lock for tens of consecutive identical bits without requiring a large external capacitor (to increase the RC time constant of the low-pass filter).

However, the phase locked loop circuit loses the lock when the number of consecutive identical bits reaches the hundreds. In addition, the phase locked loop circuit may fail to lock altogether when the input data frequency differs significantly from the phase locked loop's free-running frequency (or the initial oscillation frequency at time t=0) Moreover, the phase locked loop circuit suffers from harmonic lock.

SUMMARY OF THE INVENTION

It is therefore an object of this invention to provide a data and clock recovery PLL circuit which is stable in the operation.

It is another object of this invention to provide a data and clock recovery PLL circuit which can guarantee pull-in.

It is still another object of this invention to provide a data and clock recovery PLL circuit which has no problems with harmonic lock.

Other objects of this invention will become clear as the description proceeds.

On describing the gist of this invention, it is possible to understand that a data and clock recovery phase locked loop circuit extracts a clock signal from random input data.

According to a gist of this invention, a data and clock recovery phase locked loop circuit comprises a delay block for delaying the random input data to produce delayed random input data. A data transition detecting block detects transitions of the random input data to produce a window signal. A phase comparing block is connected to the delay block and compares phase of the delayed random input data with phase of a feedback signal to produce a phase compared signal representative of difference between the phase of the delayed random input data and the phase of a feedback signal. A charge pump block is connected to the phase comparing block and produces output voltage in response to the phase compared signal. A filter block is connected to the charge pump block to filter the output voltage into DC voltage. A voltage controlled oscillator is connected to the filter block to generate the clock signal which has a frequency depending on the DC voltage. A multiplexer block is connected to the voltage controlled oscillator, the data transition detecting block and the phase comparing block and selects one from a predetermined logical level and the clock signal to supply a selected signal to the phase comparing block as the feedback signal.

According to another gist of this invention, a data and clock recovery phase locked loop circuit comprises a delay block which delays the random input data to produce delayed random input data. A data transition detecting block detects transitions of the random input data to produce a window signal. A shifting block is connected to the data transition detecting block and shifts the window signal to produce a shifted window signal. A phase comparing block is connected to the delay block and the shifting block and compares phase of the delayed random input data with phase of the shifted window signal to produce a phase compared signal representative of difference between the phase of the delayed random input data and the phase of the shifted window signal. A charge pump block is connected to the phase comparing lock and produces output voltage in response to the phase compared signal. A filter block is connected to the charge pump block and filters the output voltage into DC voltage. A voltage controlled oscillator is connected to the filter block to generate the clock signal which has a frequency depending on the DC voltage.

BRIEF DESCRIPTION OF THE DRAWING

FIG. 16 is a block diagram of a data and clock recovery PLL circuit according to a fifth example of this invention.

DESCRIPTION OF THE PREFERRED EMBODIMENTS

Referring to FIGS. 1 to 5, description will be at first directed to a conventional data and clock recovery PLL circuit for a better understanding of this invention.

Figure 1:
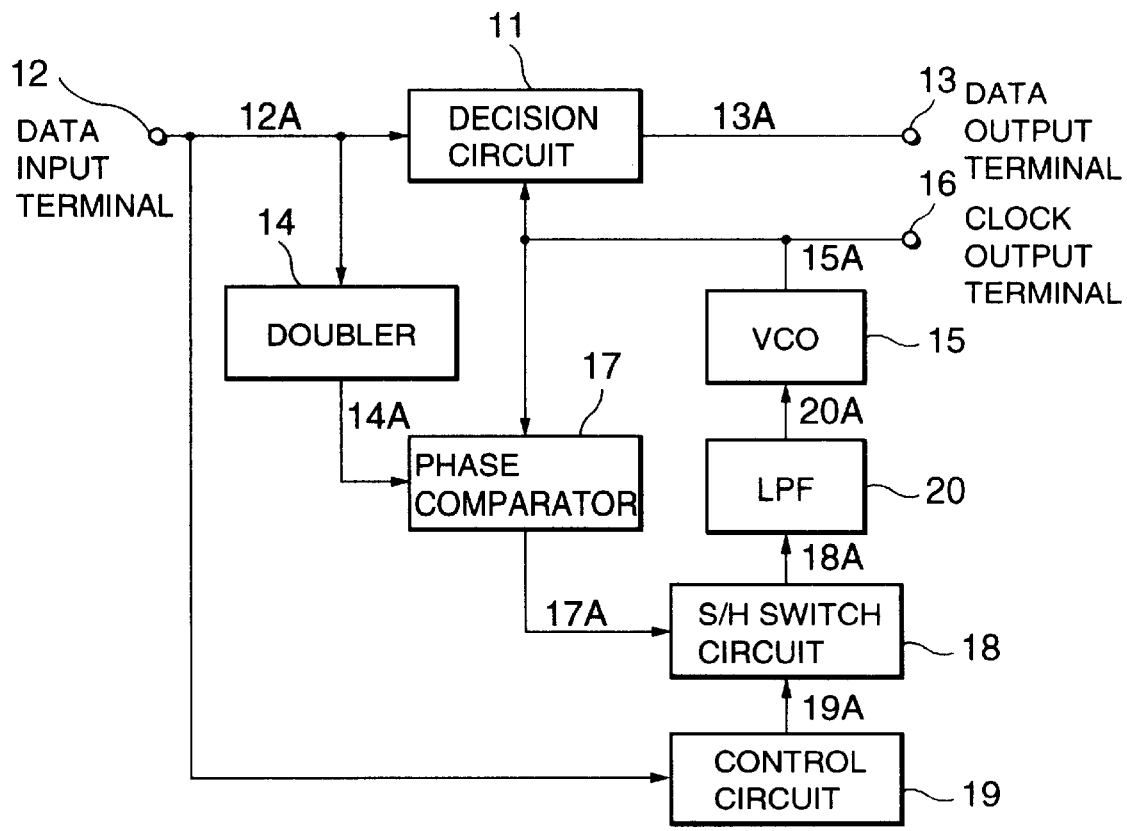
FIG. 1 is a block diagram of a conventional data and clock recovery PLL circuit.

In FIG. 1, the conventional data and clock recovery PLL circuit has a decision circuit 11 which is connected between a data input terminal 12 and a data output terminal 13. The decision circuit 11 receives a data input signal 12A from the data input terminal and decides a logical state of the input data signal 12A and supplies an output data signal 13A to the output terminal 13. A doubler 14 is connected to the data input terminal to doubles the input data signal 12A and to produce a doubled input data signal 14A. A voltage-controlled oscillator (VCO) produces a clock signal 15A to supply the clock signal 15A to both a clock output terminal 16 and the decision circuit 11. A phase comparator 17 is connected to the doubler 14 and the VCO 15 to compare the doubled input data signal 14A with the clock signal 15A and to produce a comparison signal 17A. A sample and hold (S/H) switch circuit 18 is connected to the phase comparator 17 and samples and holds the comparison signal 17A to produce an S/H signal 18A. A control circuit 19 is connected to the data input terminal 12 and the SIR switch circuit 18 to produce a control signal 19A according to the input data signal 12A for controlling the S/H circuit 18. A low pass filter (LPF) is connected to the S/H switch circuit 18 and the VCO 15 and filters the S/H signal 18A to supply a filtered signal 20A to the VCO 15.

Figure 2:
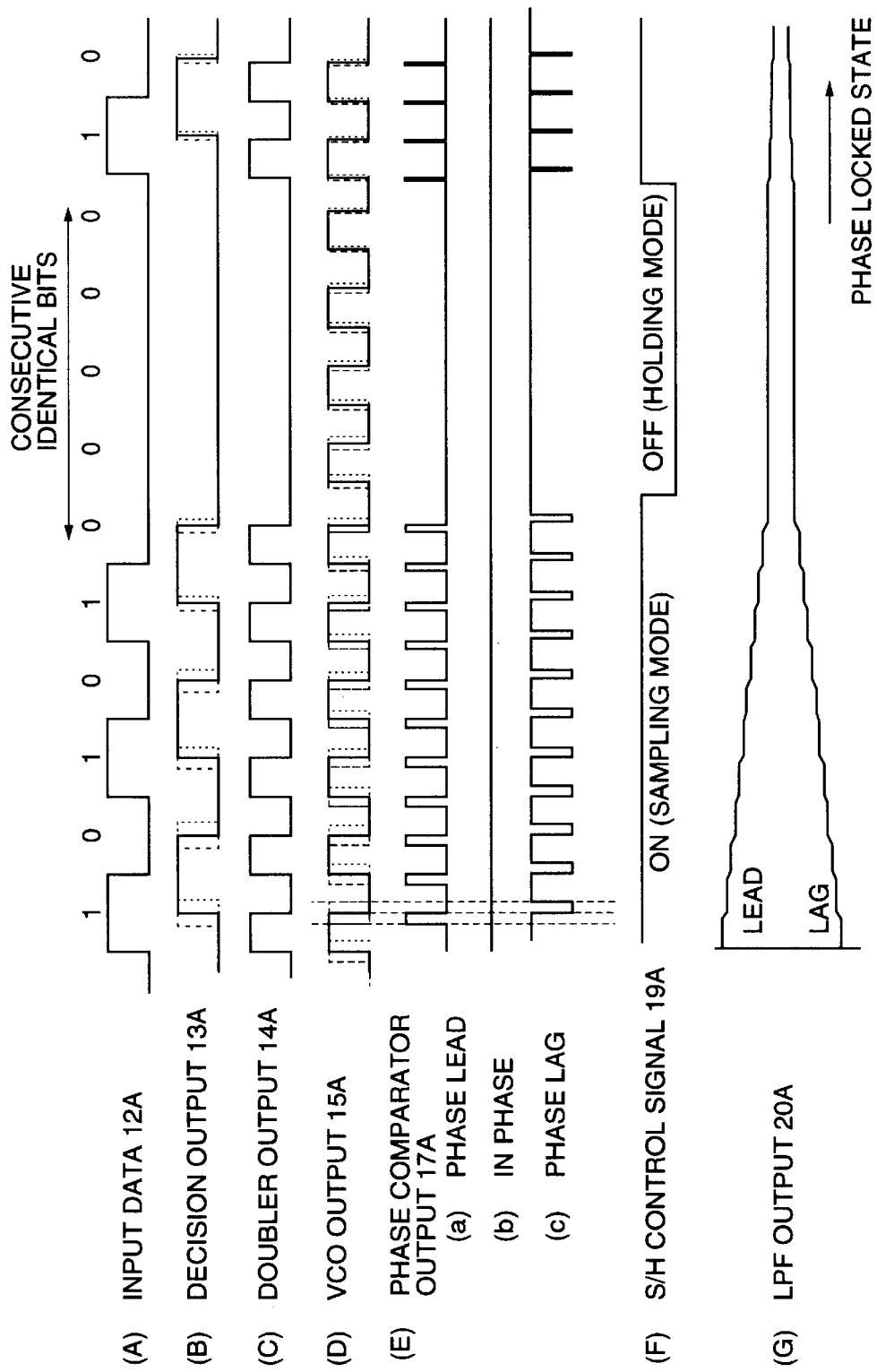
FIG. 2 shows waveforms of the conventional data and clock recovery PLL circuit of FIG. 1.

FIG. 2 illustrates operational waveforms of critical nodes of the ELL circuit shown in FIG. 1. The doubler 14 converts the input data 12A illustrated on a top line of FIG. 2 into the doubled input data signal 14A illustrated on a third line of FIG. 2. The phase comparator 17 compares the doubled input data signal 14A with the clock signal 15A illustrated on a fourth line of FIG. 2 to produce the comparison signal 17A illustrated on fifth through seventh lines of FIG. 2. The comparison signal 17A represents phase difference between the doubled input data signal 14A and the clock signal 15A. When the phase of the clock signal 15A leads the phase of the doubled input data signal 14A, the phase comparator 17 generates a pulse train of positive pulses whose width equals their phase difference as illustrated on the fifth line of FIG. 2. Conversely, when the phase of the clock signal 15A lags behind that of the doubled input data signal 12A, the phase comparator 17 produces a pulse train of negative pulses whose width equals their phase difference as shown on the seventh line of FIG. 2. When there is no phase difference between the two signals, no pulse output is produced by the phase comparator 17 as shown on the sixth line of FIG. 2.

The comparison signal 17A is subsequently supplied to a S/H switch circuit 18. Moreover, the control signal 19A illustrated on a eighth line of FIG. 2 is supplied from the control circuit 19 to the S/H switch circuit 18. The control signal 19A turns the S/H switch circuit 18 into an ON state or an OFF state. When the S/H switch circuit is in the ON state, the PLL is referred to be in the "sampling mode", i.e. a phase comparison occurs and the PLL operates normally. In contrast, when the S/H switch circuit is in the OFF state, the PLL is referred to be in the "holding mode" and no phase comparison occurs. The "holding model" allows the PLL to maintain stable operation for a long succession of consecutive identical bits (ZEROs or ONES).

The LPF converts the S/H signal 18A into a DC (direct current) voltage as the filtered signal 20A. Negative feedback operation of the PLL results in the phase difference between the doubled input data signal 14A and the clock signal 15A becoming a minimum, the so-called "phase locked state". the decision circuit 11 detects the logical state of the input data signal 12A by the use of the clock signal 15A. The decision circuit 11 retimes the input data signal 12A to produce the output data signal 13A illustrated on second line of FIG. 2.

The phase comparator 17 is in fact a Gilbert Multiplier type phase detector. The Gilbert multiplier type phase detector is shown in FIG. 3.

Figure 3:
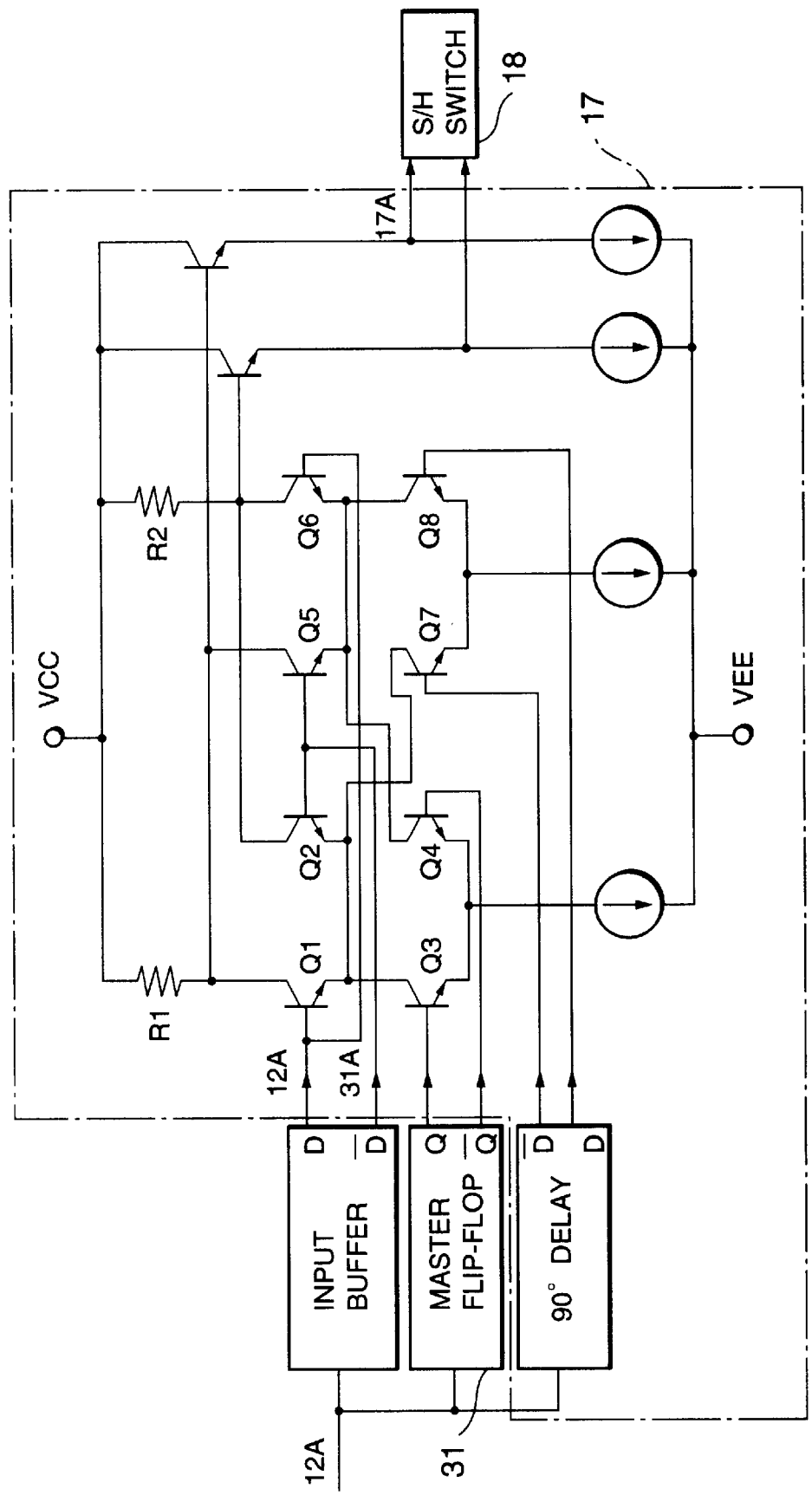
FIG. 3 is a circuit diagram of a phase comparator used in the conventional data and clock recovery PLL circuit of FIG. 1.

Referring to FIG. 3, the Gilbert Multiplier type phase detector includes a combination of two multiplier circuits. The first multiplier circuit consists of transistors Q1–Q6 and resistors R1 and R2. The first multiplier circuit compares the phase of the input data signal 12A and that of an output of a master flip-flop 31. The master flip-flop 31 is a component of the decision circuit 11 and its output signal 31A is substitute for the clock signal 15A. (Details are disclosed in U.S. Pat. No. 5,557,648.)

The second multiplier circuit consists of Q1, Q2 and Q5–Q8, and resistors R1 and R2. The second multiplier circuit compares the phase of the input data signal 12 and that of a 90-degree delayed input data signal. An average DC output level of the second multiplier depends only on a mark ratio of the input data signal because the second multiplier compares the two signals whose phase difference is 90 degrees. Therefore, subtracting the output of the second multiplier from that of the first multiplier cancels the effect of the mark ratio. As a result, a phase difference output between the master flip-flop output and the 90-degee delayed input data, which is independent of the mark ratio, can be obtained. The VCO frequency can be stably controlled by the use of the phase difference output.

Figure 4:
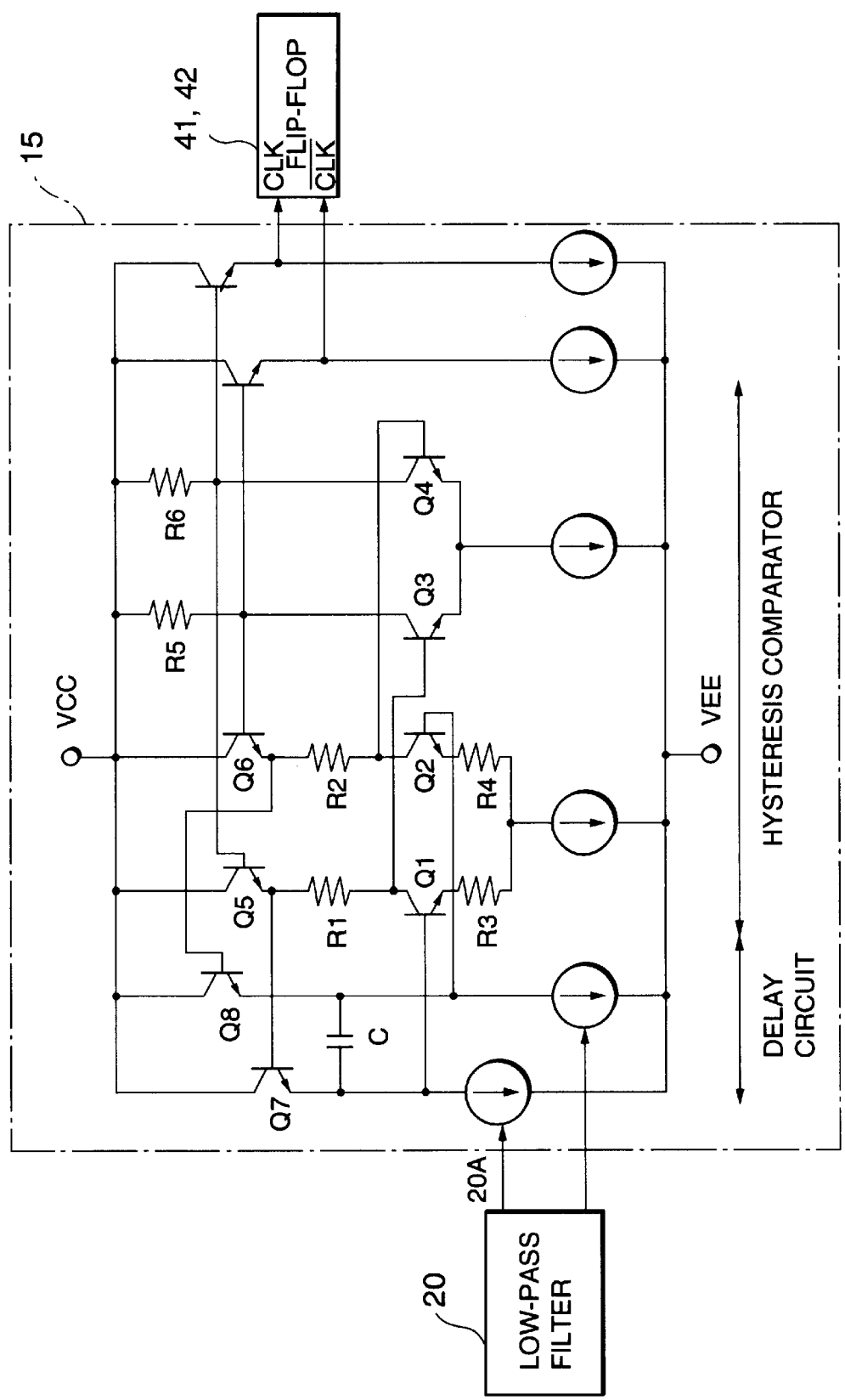
FIG. 4 is a circuit diagram of a voltage controlled oscillator used in the conventional data and clock recovery PoT. circuit of FIG. 1.

FIG. 4 shows an emitter-coupled multivibrator VCO which is used as the voltage controlled oscillator 15. The emitter-coupled multivibrator VCO includes a hysteresis comparator which consists of transistors Q1–Q6 and resistors R1–R6. The hysteresis comparator uses a positive feedback technique. In this structure, bases of the transistors Q3 and Q4 are differential input terminals. The output signal of the hysteresis comparator is inverted when the input signal swings across a certain voltage. A delay circuit consists of the transistors Q7–Q8 and a capacitor C. A charging current Ic flowing into the capacitor C provides a delay time of the delay circuit. Oscillation of the VCO 15 is obtained by the positive feedback from the output to the input of the hysteresis comparator through the delay circuit. The delay time of the delay circuit and the hysteresis characteristics of the hysteresis comparator determine the oscillation frequency. Hence the oscillation frequency can be varied by controlling the charging current Ic. The emitter-coupled multi vibrator VCO 15 provides the output signal to clock terminals of two flip-flops 41 and 42. The flip-flops 41 and 42 are components of the decision circuit 11. One of the flip-flops 41 and 42 corresponds to the master flip-flop 31 shown in FIG. 3.

Such a data and clock recovery PLL circuit is disclosed in U.S. Pat. No. 5,557,648.

However, the conventional PLL circuit has several problem.

At first, while this circuit can maintain stable lock for tens of consecutive identical bits without requiring a large external capacitor (to increase the RC time constant of the low-pass filter), it soon loses lock when the number of consecutive bits reaches the hundreds.

Bipolar base current at the input node of the emitter coupled multivibrator VCO shown in FIG. 4 causes the frequency (Fclk) of the S/H signal 18A to droop with time. This is clearly illustrated in a simulation result shown in FIG. 5. The simulation result was verified by the use of a mixed mode behavioral simulator, i.e. SABER (TM) on a work station. In this particular simulation, an input data transmission rate of 1.25 Gbps is assumed. Device parameters are base on a L=0.35 μm, epitaxial-less BiCMOS process, $f_T$=20 GHz at Vcc=1V. Natural frequency ωn=12.6×10$^6$ rads/sec and damping factor ζ=1.0 are assumed.

While the PLL circuit achieves stable lock at Fclk 1.25 GHz during data preamble (100% data density), Fclk droops with time when the data density goes to zero (t>6 μs). This droop ultimately determines the maximum allowed number of bits between transitions before a retiming error occurs. The retiming error occurs in FIG. 5 after only a 124-bit string of ZEROs is processed.

Secondly, the conventional PLL circuit fails to lock altogether when the input data frequency differs significantly from the PLL's free-running frequency (initial oscillation frequency at time t=0). Namely, failure to achieve lock at the desired target frequency occurs because of the limited pull-in range of the conventional PLL circuit.

Figure 5:
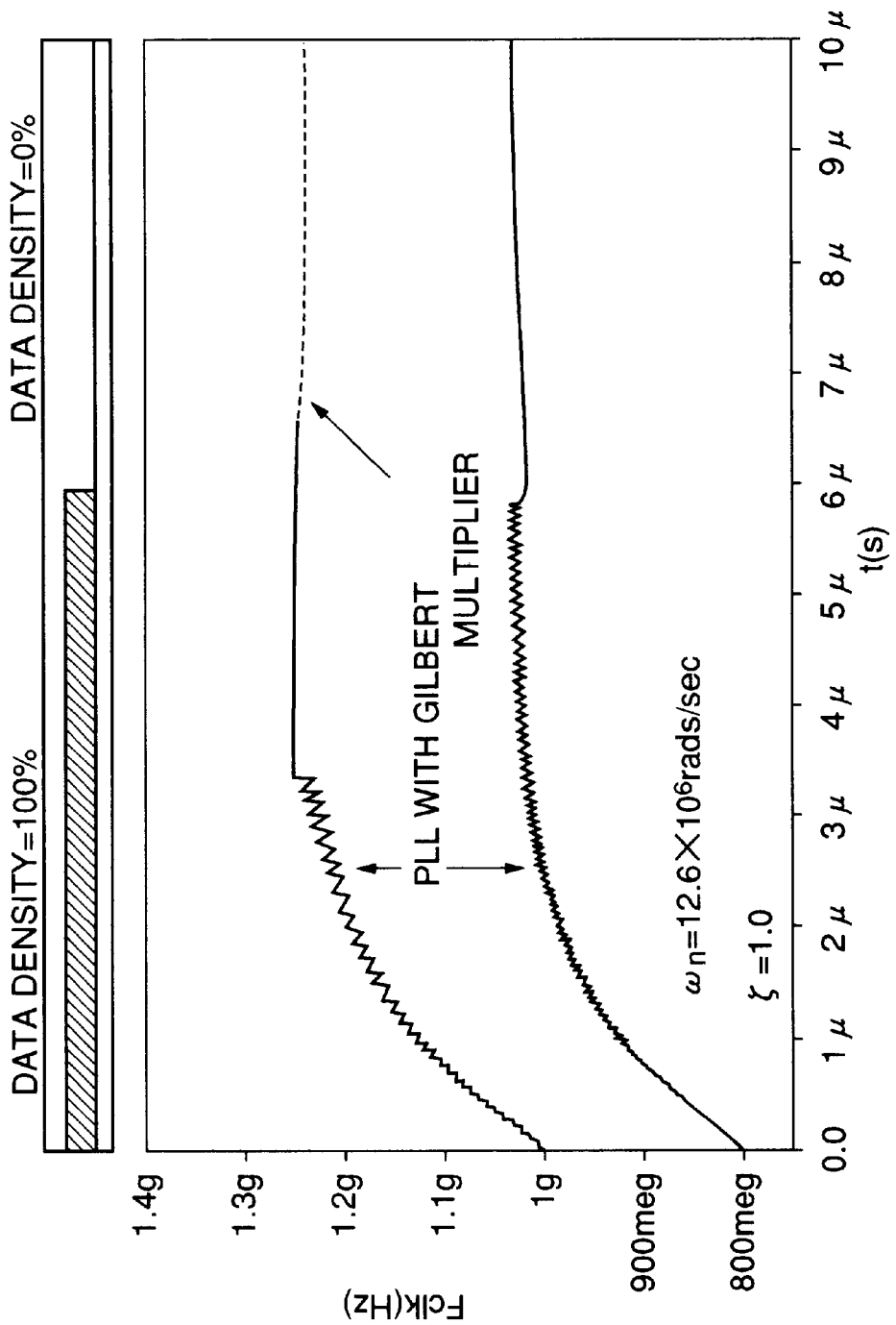
FIG. 5 is a graph illustrating simulation results of the conventional data and clock recovery PUT circuit of FIG. 1.

Pull-in range defines the maximum frequency offset between the target frequency and the PLL's free-running frequency at which a pull-in process is possible. Within this range, a PLL will always become locked. The pull-in process can however be rather slow. In FIG. 5, the PLL circuit acquires the correct frequency (Fclk=1.25 GHz) when the PLL's free-running frequency equals 1 GHz but acquires the wrong frequency when it equals 80 MHz. Process variations result in the part-to-part variation (1 GHz to 800 MHz) of the PLL's free-running frequency.

A third problem, which the conventional PLL circuit suffers from, is harmonic lock. It locks on harmonics since its lock voltage is determined by duty cycles of the input data signals. The phase difference output of the Gilbert Multiplier phase detector is determined by an average ON time of its transistors. The average ON time of the transistors is the same for example when phase comparing input signals of frequencies (f and f) and (f and 2f).

Other conventional PLL circuits are disclosed in U.S. Pat. Nos. 5,097,489 and 5,374,860 and in "DIGEST OF TECHNICAL PAPER" of 1988 IEEE International Solid-State Circuits Conference.

However these PLL circuits have faults like the problems as mentioned above.

Figure 6:
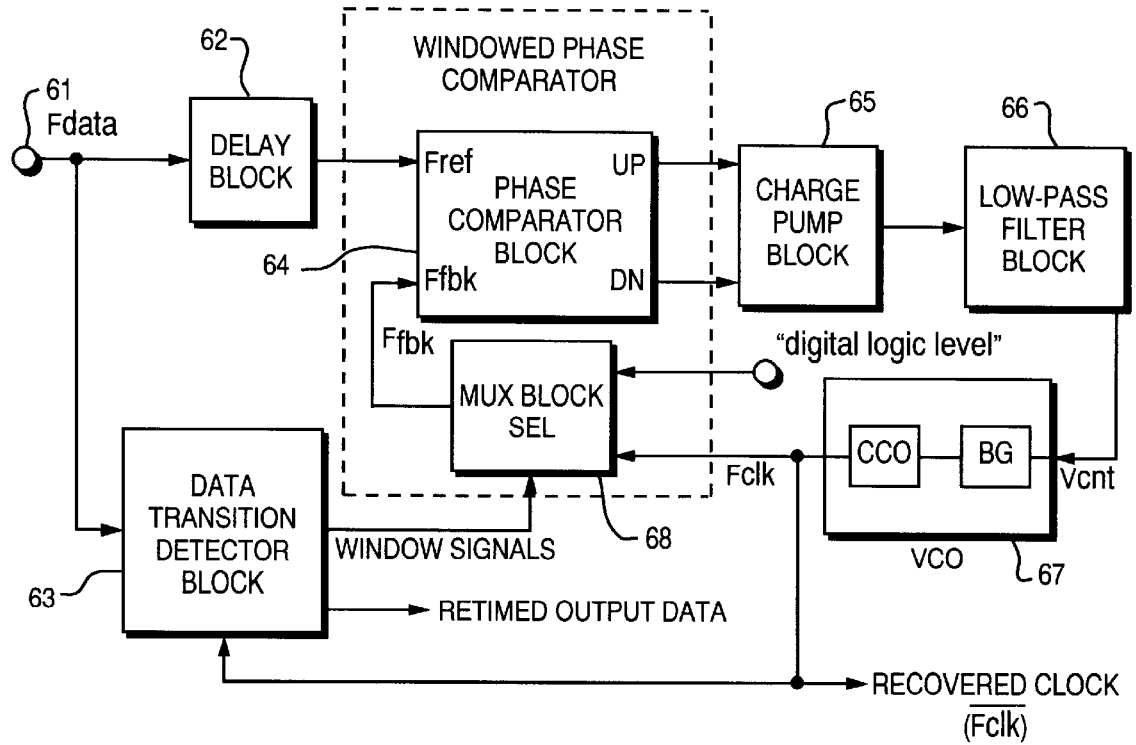
FIG. 6 is a block diagram of a data and clock recovery PLL circuit according to a first embodiment of this invention.
Figure 7:
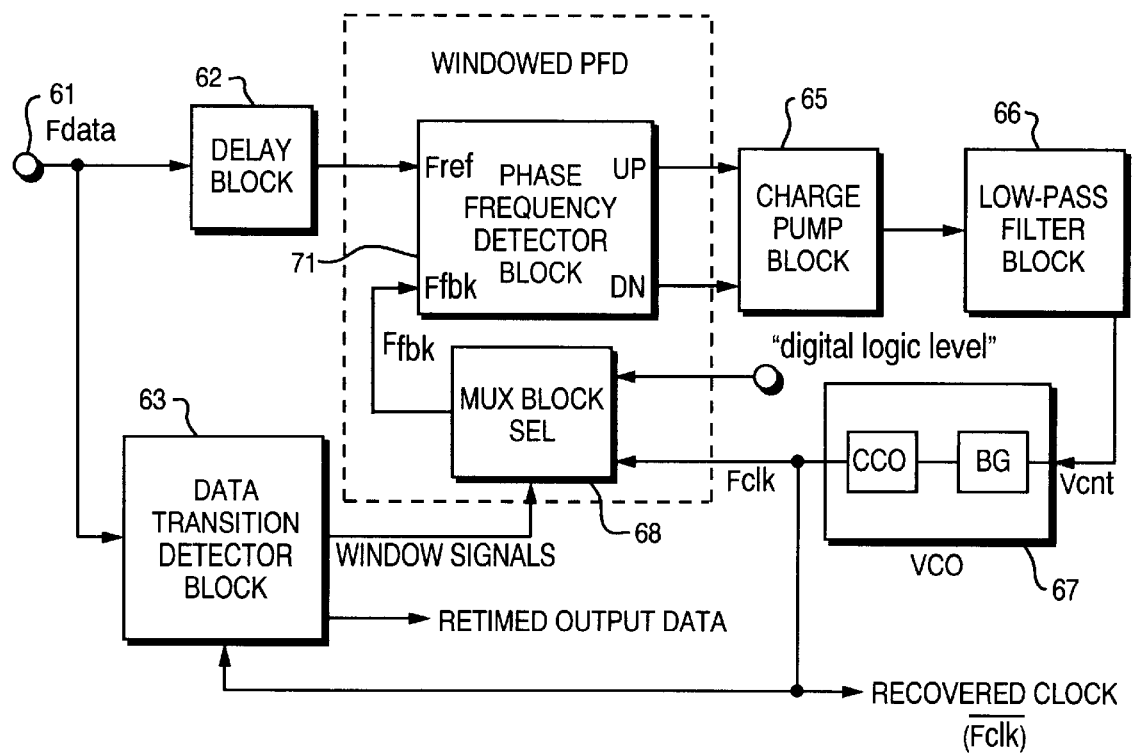
FIG. 7 is a block diagram of an instance of the data and clock recovery PUT circuit of FIG. 6.
Figure 8:
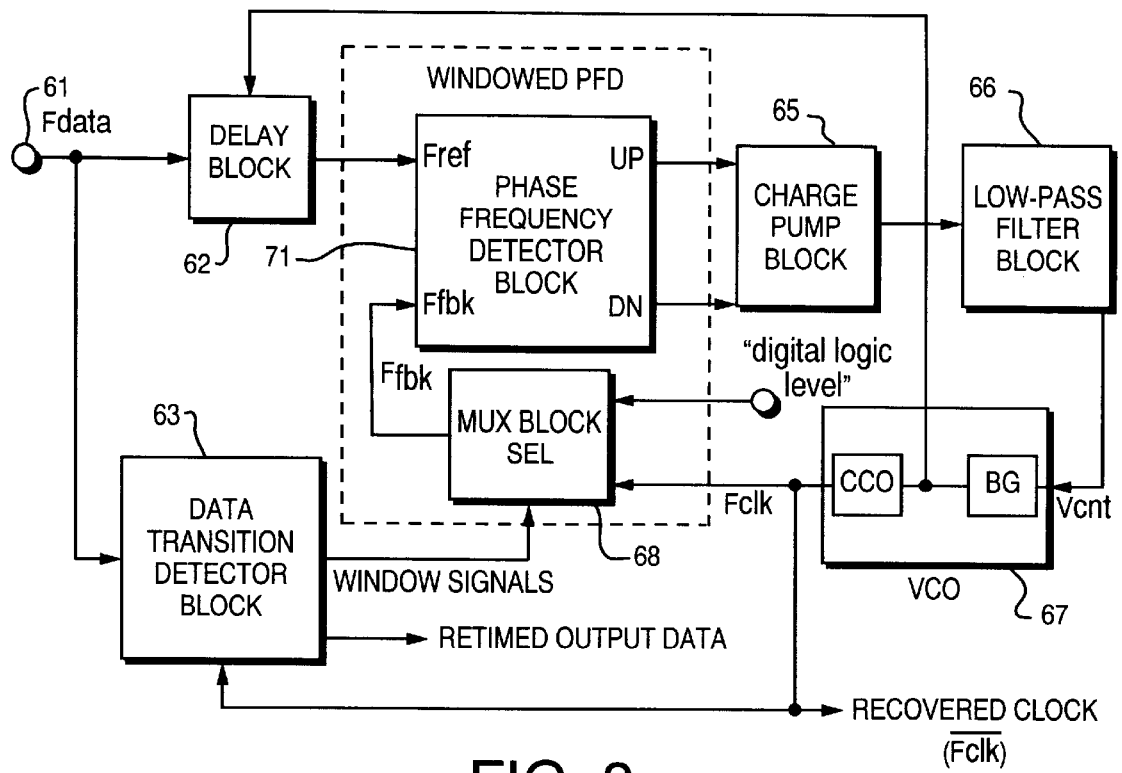
FIG. 8 is a block diagram of another instance of the data and clock recovery PLL circuit of FIG. 6.

Referring to FIGS. 6 through 8, description will proceed to a data and clock recovery PLL circuit according to a first embodiment of this invention.

In FIG. 6, a data and lock recovery PLL circuit according to a first embodiment comprises a data input terminal 61 for supplying a digital data stream (Fdata) of n (=2$^N$−1) bits in length.

A tapped delay block 62 is connected to the data input terminal 61 and consists of delay circuit to delay the digital data stream. A data transition detector block 63 is connected to the data input terminal 61 to detect transitions in the input data stream and to produce window signals each of which keeps "high" level while one bit whenever the data transition detector block 63 detects the transitions. A phase comparator block 64 is connected to the delay block 62 and consists of a number of phase comparators. Each phase comparator detects a phase difference between the delayed data stream signal supplied from the delay block 62 and a feedback signal (Ffbk). The phase comparator block 64 produces output signals in response to the phase difference. A charge pump circuit block 65 is connected to the phase comparator block 64 to produce charge/discharge voltage according to the phase difference between its inputs (i.e. the output signals of the phase comparator block 64). A low-pass filter block 66 is connected to the charge pump circuit block 65 and is charged and discharged by the charge/discharge voltage supplied form the charge pump circuit block 65. A voltage controlled oscillator (VCO) 67 is connected to the low-pass filter block 66 and consists of a bias generator (BG) and a current controlled oscillator (CCO) to generate a set of clock signals (Fclk) whose frequencies are determined by the output of the low-pass filter block 66. A multiplexer block 68 is connected to the VCO 67, the data transition detector 63, and the phase comparator block 64 and consists of an integer number of multiplexers. Each multiplexer receives the clock signal and a digital logic level and chooses one from them in response to value of the window signal supplied to the select input of the multiplexer from the data transition detector block 63. Each multiplexer steers the chosen signal to the phase comparator block 64 as a feedback signal (Ffbk).

Operation of the PLL circuit of FIG. 6 is described in below.

The phase comparator block 64 is, for example, a phase frequency detecting block 71 as shown in FIG. 7. The phase frequency detecting block 71 includes a phase frequency detector (PFD).

It is a well-known fact that the PFD acquires a correct frequency when the number of transition edges in its input signal (Fref) equals the number of edges in its feedback signal (Ffbk). However, in data and clock recovery PLL applications, the input signal is random input data and the recovered clock Fclk is used as the feed back signal Ffbk. As a result, the number of edges in the input signal (Fref) will always be different from the number of edges in the feedback signal (Ffbk) in the PLL circuit. Therefore, some means of controlling the number of edges in the feed back signal Ffbk in response to input data Fref is required. When a data transition ("0" to "1" or "1" to "0") is detected, the VCO output clock signal Fclk needs to be fed back to the PFD. Otherwise, a signal having no transitions/edges (i.e. the digital logic level) needs to be fed back.

It was thought that the easiest means of controlling the feedback signal would be to use the multiplexer block 68 with the digital logic level applied to one input and the clock signal Fclk applied to the other input. To maintain the phase locked state, control signals are applied to the select inputs of the multiplexer block 68. These control signals define "windows" within which the Fclk pulses are transferred through the multiplexer block 68 back to the PFD block 71. These control signals are referred to as window signals. Since these window signals must respond to input data changes, some means of detecting data transitions is necessary. A data transition detector (DTD) circuit block 63 functions to detect transitions in the input data and to output window signals for detected transitions.

Since the number of edges in Fref and Ffbk of the PFD block 71 must be the same, the DTD block 63 also functions to only allow one Falk pulse through for every detected data transition. Assuming that the PFD block 71 compares the phases on a particular edge (rising or falling edge) of its input data (Fref or Fclk), the window signals must be generated on the opposite edge (falling or rising respectively) of Fclk. Hence the DTD block 63 is clocked by the clock signal Falk. The negative feedback operation of the PLL circuit adjusts the position of the window signals until the phase locked state is achieved.

Since time is needed to generate the window signals which control the feedback signals of the PFD block 71, a means of delaying the input data (Fref input signal) is required. A delay block 62 functions to delay the input data.

Therefore, the PLL circuit guarantees that stable lock can be maintained monolithically for hundreds of consecutive bits, a pull-in process automatically occurs and that the PLL does not lock on harmonics.

The delay circuit block 62 may be supplied with the output of the bias generator BG to adjust the delay time as shown in FIG. 8. With this structure, it becomes short that the PLL circuit is in the locked state.

The phase frequency detector (PFD) may be a digital frequency detector which is illustrated as PD4 type in a table 2-1 on page 8 of "PHASE-LOKED LOOPS Theory, Design, and Applications" published by McGRAW-HILL BOOK COMPANY.

Figure 9:
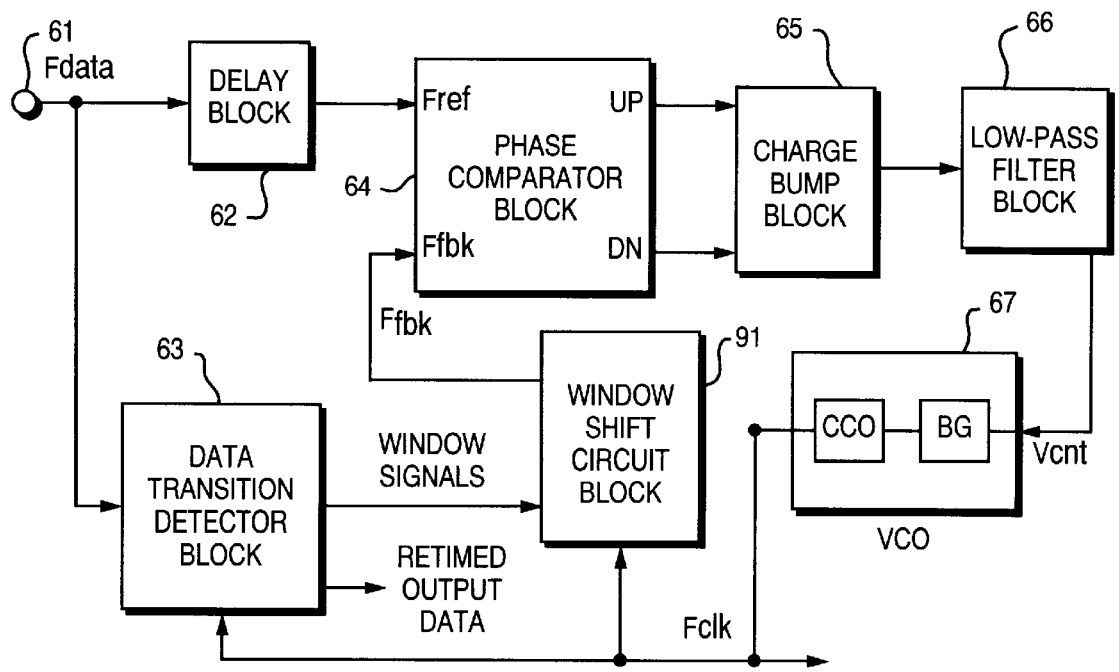
FIG. 9 is a block diagram of a data and clock recovery PLL circuit according to a second embodiment of this invention.

Referring to FIG. 9, a second embodiment of this invention will be described.

In FIG. 9, a PLL circuit has a window shift circuit block 91 instead of the multiplexer block 68 of FIG. 6. The window shift circuit block 91 supplies the window signal sent from the data transition detector block 63 in synchronization with the clock signal Fclk. With this structure, phase lock is maintained by the use of the shifted window signal produced by the window shift circuit block 91. This embodiment is recommended for applications where a wider pulse feedback signal (than that of the VCO clock signal) is required by the phase comparator block 64 or a level converter placed in the feedback signal path.

Figure 10:
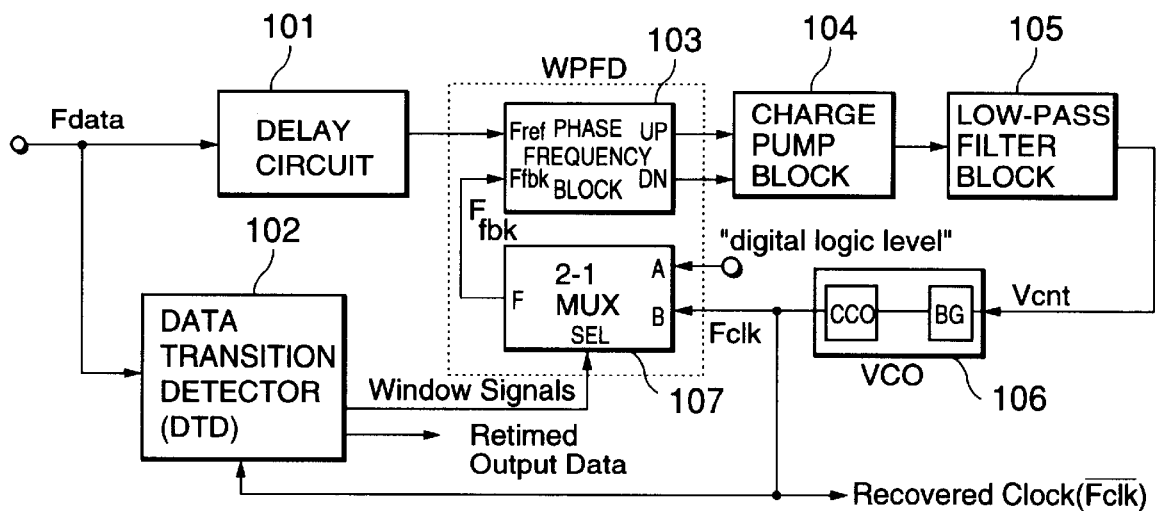
FIG. 10 is a block diagram of a data and clock recovery PLL circuit according to a first example of this invention.

In FIG. 10, a PLL circuit according to a first example of the first embodiment has a delay circuit 101, a data transition detector 102, a phase frequency detector 103, a charge pump circuit 104, a low-pass filter 105, a VCO 106, and a 2-1 multiplexer 107. The PLL circuit operates like the PLL circuit of FIG. 6. Because the PLL circuit has the single phase frequency detector 103, the single ca pimp circuit 104, and the single multiplexer 107, it is recommended for lower frequency applications. Moreover, since either zero-to-one transitions or one-to-zero transitions drive the PLL circuit, this circuit is also recommended for applications where input data duty-cycle variations are considered a problem.

Referring to FIGS. 11 through 14 a second example is explained below.

Figure 11:
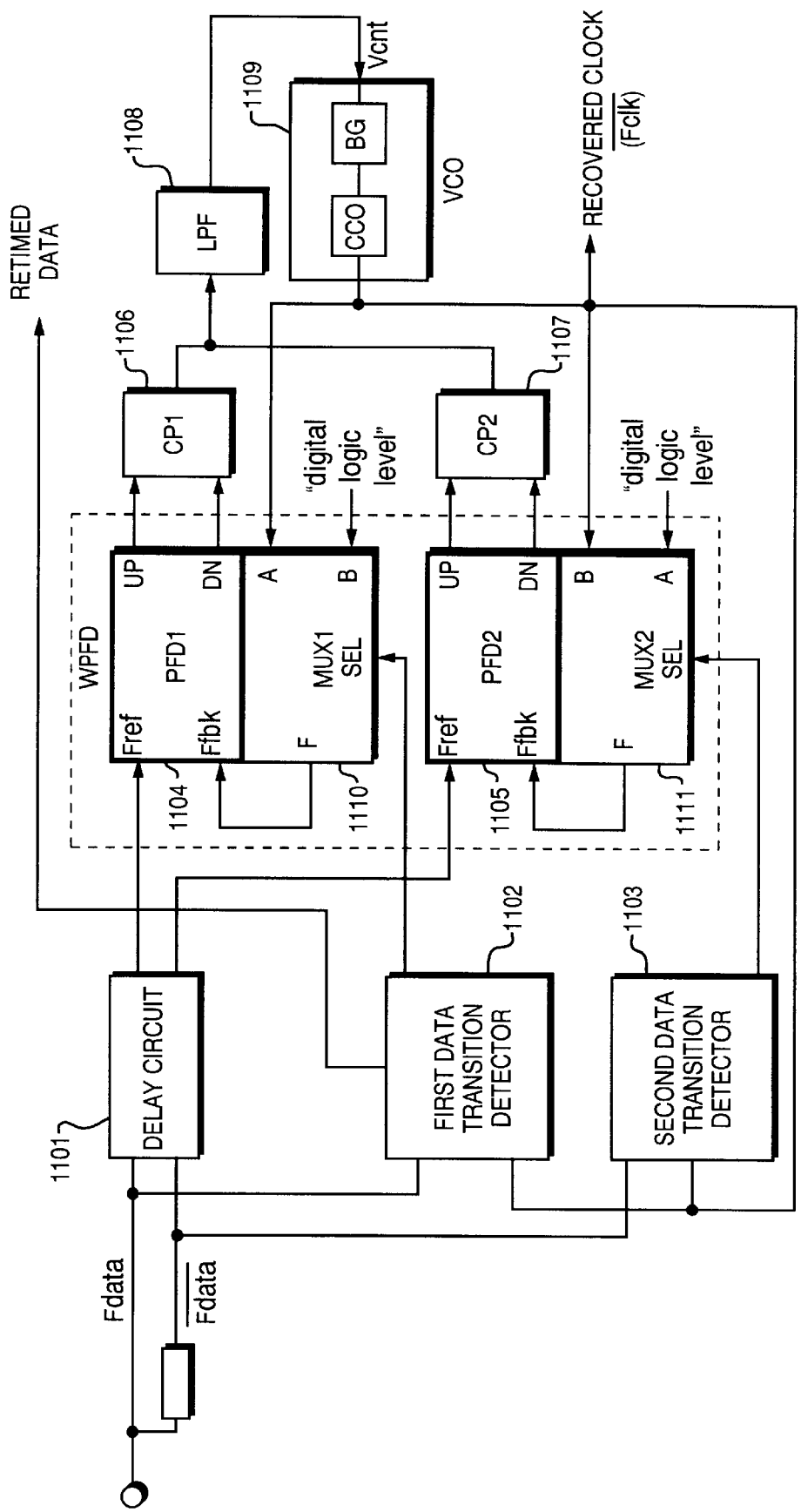
FIG. 11 is a block diagram of a data and clock recovery PLL circuit according to a second example of this invention.

In FIG. 11, a PLL circuit comprises a delay circuit 1101, first and second data transition detectors 1102 and 1103, first and second phase frequency detectors (PFD1 and PFD2) 1104 and 1105, first and second charge pump circuits (CP1 and CP2) 1106 and 1107, a loop filter (LPF) 1108, a VCO 1109, and first and second multiplexers 1110 and 1111. Herein, a random input data stream is previously divided into two divided random input data stream and one of them is inverted. A detail of the PLL circuit is illustrated in FIG. 12.

Figure 12:
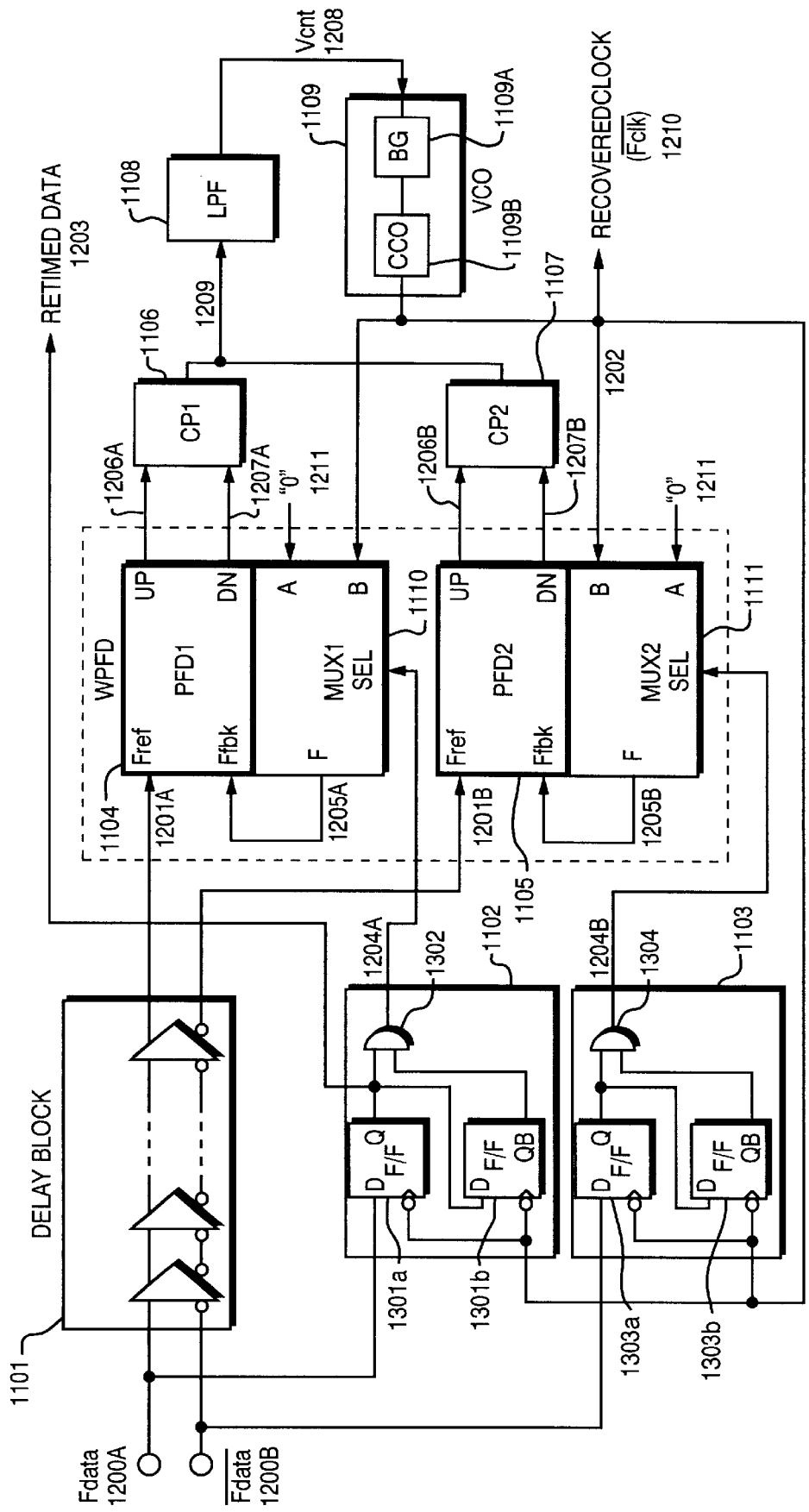
FIG. 12 is a block diagram of an instance of the data and clock recovery PLL circuit of FIG. 11.
Figure 13:
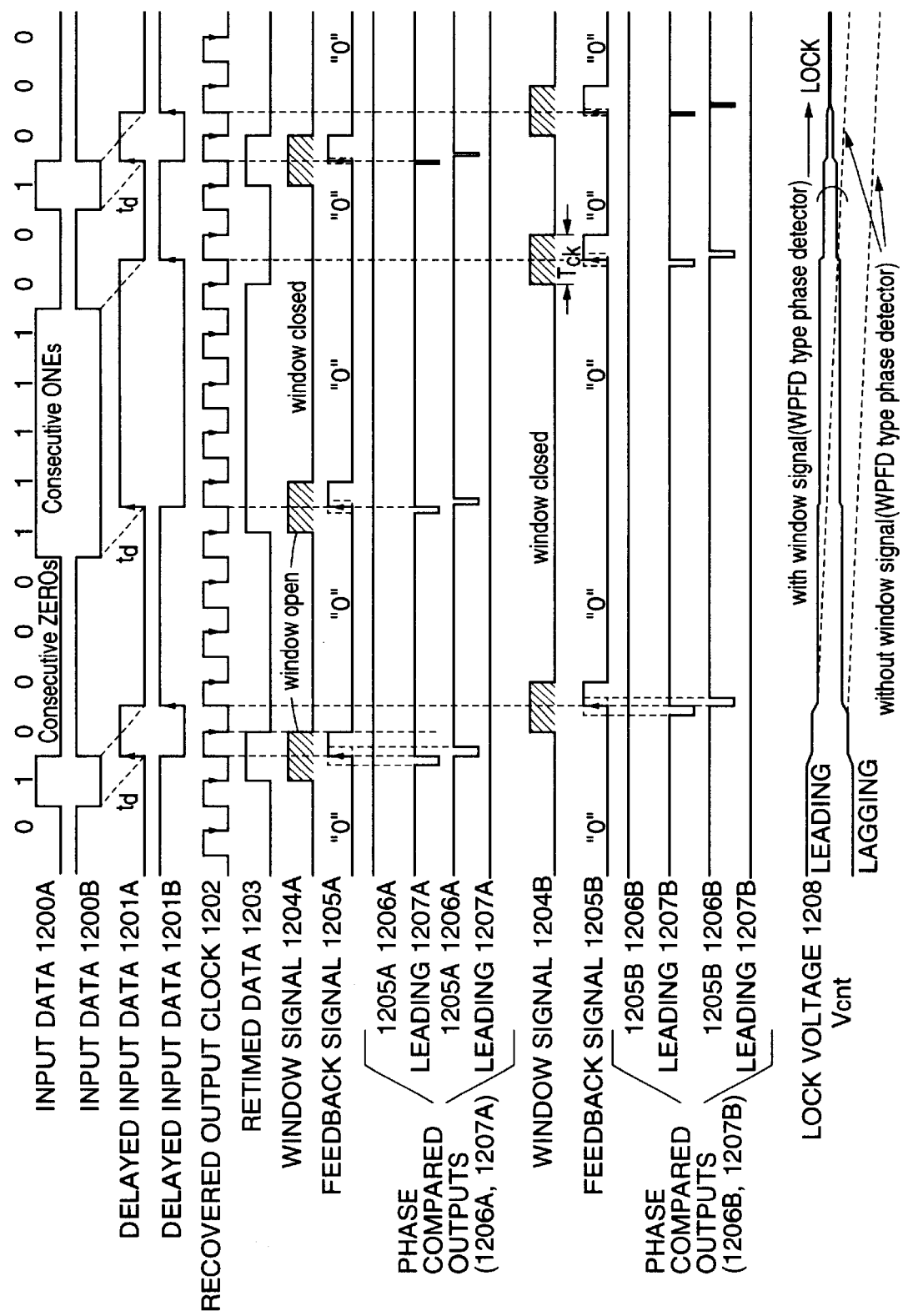
FIG. 13 shows a timing chart of the PLL circuit of FIG. 12.

An operation of the PLL circuit is described with referring to FIGS. 12 and 13.

FIG. 13 illustrates the timing chart for important nodes of the PLL circuit shown in FIG. 12 during the phase lock process. FIG. 13 shows waveforms of the input data 1200A and 1200B, the delayed input data 1201A and 1201B produced by the delay circuit 1101, the VCO clock signal (Fclk) 1202 produced by the VCO 1109, the retimed data 1203 provided by the first data transition detector 1102, the window signals 1204A and 1204B produced by the first and the second data transition detectors 1102 and 1103 respectively, the feedback signals 1205A and 1205B produced by the first and the second multiplexers 1110 and 1111 respectively, the phase compared outputs (1206A, 1207A) and (1206B, 1207B) produced by the first and the second phase frequency detectors 1104 and 1105 respectively, the DC lock voltage 1208 produced by the loop filter 1108. The Phase compared outputs are illustrated in terms of phase lead and phase lag.

The delay circuit 1101 delays the input data 1200A and 1200B by an amount "td" to produce the delayed input data 1201A and 1201B. The delayed input data 1201A and 1201B are respectively supplied to Fref inputs of the PFD1 and the PFD2. The PLL circuit shown in FIG. 12 operates correctly for 0.5 bit<td<1.5 bits. In FIG. 12, a delay of "td"=1 bit is produced in delay circuit 1101 by the use of buffers connected in series.

The data transition detectors DTD1 and DTD2 are used to detect transitions in input data 1200A and 1200D respectively. The DTD1 is supplied with the input data 1200A and the clock signal 1202 and produces the window signal 1204A. The DTD1 detects rising edges ("0" to "1" transitions) in input data 1200A. The window signal 1204A is supplied to a select terminal of the multiplexer 1110.

Similarly, the DTD2 is supplied with the input data 1200B and the clock signal 1202 and produces the window signal 1204B. The DTD2 detects rising edges ("0" to "1" transitions) in input data 1200B. The window signal 12049 is supplied to a select terminal of multiplexer 1111.

A detailed explanation is made about the DTD1 and DTD2. The DTD1 consists of two flip-flops 1301a and 1301b and one AND gate 1302. The flip-flops 1301a and 1301b are clocked on the falling edge of the clock 1202 since the window signal 1204 needs to extract the rising edge of VCO clock signal 1202 (assuming that the PFD1 compares phases on the rising edges of input data signals 1201A and the feedback signal 1205A). The flip-flops 1301a and 1301b and AND gate 1302 are connected in a manner that the window signal 1204A produced only remains high for exactly one data bit for every detected data transitions. This guarantees that the number of transition edges in the delayed input signal 1201A equals the number of transition edges in the feedback signal 1205A. The flip-flop 1301a detects the logical state of the input data 1200A by the use of the falling edge of the VCO clock signal 1202 and produces the retimed data 1203 as shown in FIG. 13.

On the other hand, the DTD2 consists of two flip-flops 1303a and 1303b and one AND gate 1304. The flip-flops 1303a and 1303b are clocked on the falling edge of the clock signal 1202 since the window signal 1204B needs to extract the rising edge of the VCO clock signal 1202 (assuming that PFD2 compares phases on the rising edges of the input data 1201B and the feedback signal 1205B). The flip-flops 1303a and 1303b and the AND gate 1304 are connected in a manner that the window signal 1204B only remains high for exactly one data bit for every detected data transition. This guarantees that the number of transition edges in the delayed input data signal 1201B equals the number of transition edges in the feedback signal 1205B.

Turning back to FIG. 12, the well-known phase frequency detectors (PFD1 and PFD2) are interleaved to guarantee circuit operation at very high input data frequencies. The PFD1 receives the delayed input data 1201A and the feedback signal 1205A and produces the phase compared signals 1206A and 1207A.

A delayed form of the input data 1200A is supplied to the reference terminal of the PFD1. The VCO clock signal 1202 that fall within the window signal 1204A is supplied to the feedback terminal of the PFD1. The PFD1 functions to generate a pump-up output signal 1206A when the phase of the delayed input data signal 1201A lead that of the feedback signal 1205A. Similarly, the PFD1 functions to generate a pump-down output signal 1207A when the phase of the delayed input data signal 1201A lags that of the feedback signal 1205A. A delay element (not shown) may be added in the PFD1 to eliminate "dead-zone" i.e. a region of low-gain near phase lock. The PFD1 is activated by the positive-going edges of the delayed input data signal 1201A and the feedback signal 1205A.

Similarly, The PFD2 receives the delayed input data signal 1201B and the feedback signal 1205B and produces the phase compared signal 1206B and 1207B. A delayed form of the input data 1200B is supplied to the reference terminal of the PFD2. The VCO clock signal 1202 that fall within the window signal 1204B is supplied to the feedback terminal of the PFD2. The PFD2 functions to generate a pump-up output signal 1206B when the phase of the delayed input data signal 1200B leads that of the feedback signal 1205B. Similarly, the PFD2 functions to generate a pump-down output signal 1207B when the phase of the delayed input data signal 1201B lags that of the feedback signal 1205B. A delay element (not shown) may be added in the PFD2 to eliminate "dead-zone" i.e. a region of low-gain near phase lock. The PFD2 is activated by the positive-going edges of the delayed data input signal 1200B and the feedback signal 1205B.

Therefore, since the PLL circuit shown in FIG. 12 is edge triggered, the PLL circuit is not sensitive to the duty cycle of the input data signal, and hence doesn't lock on harmonics.

The charge pump CP1 receives the pump-up signal 1206A and the pump-down signal 1207A while the charge pump CP2 receives the pump-up signal 1206B and a pump-down signal 1207B. The outputs of both charge pumps CP1 and CP2 are combined into a charge pump output signal 1209. The charge pump output signal 1209 is filtered by the loop filter 1108 to produce a DC (direct current) output voltage 1208. The loop filter 1108 determines the response characteristics of the PLL i.e. natural frequency $\omega^n$ and damping factor $\zeta$.

The VCO 1109 receives the DC output voltage 1208 and produce the VCO clock signal 1202 (Fclk). The VCO 1109 consists of a bias generator 1109A and a current controlled oscillator (CCO) 1109B. The DC output voltage 1208 determines the frequency of the VCO clock signal 1202. The VCO output signal 1202 varies in a range about the mean data rate of the input data signal 1200A and 1200B in response to the varying control voltage signal 1208. The clock signal 1202 is supplied to the B input terminals of both multiplexers 1110 and 1111. The opposite phase of the VCO output signal 1202 is used as the recovered clock signal 1210.

The DC voltage 1208 is supplied to an MS input transistor (not shown) in the bias generator 1109A of the VCO 1109. The charge pumps CP1 and CP2 are both implemented in MOS technology. Hence, the output terminals of the charge pump CP1 and CP2 are very high impedance nodes.

Figure 14:
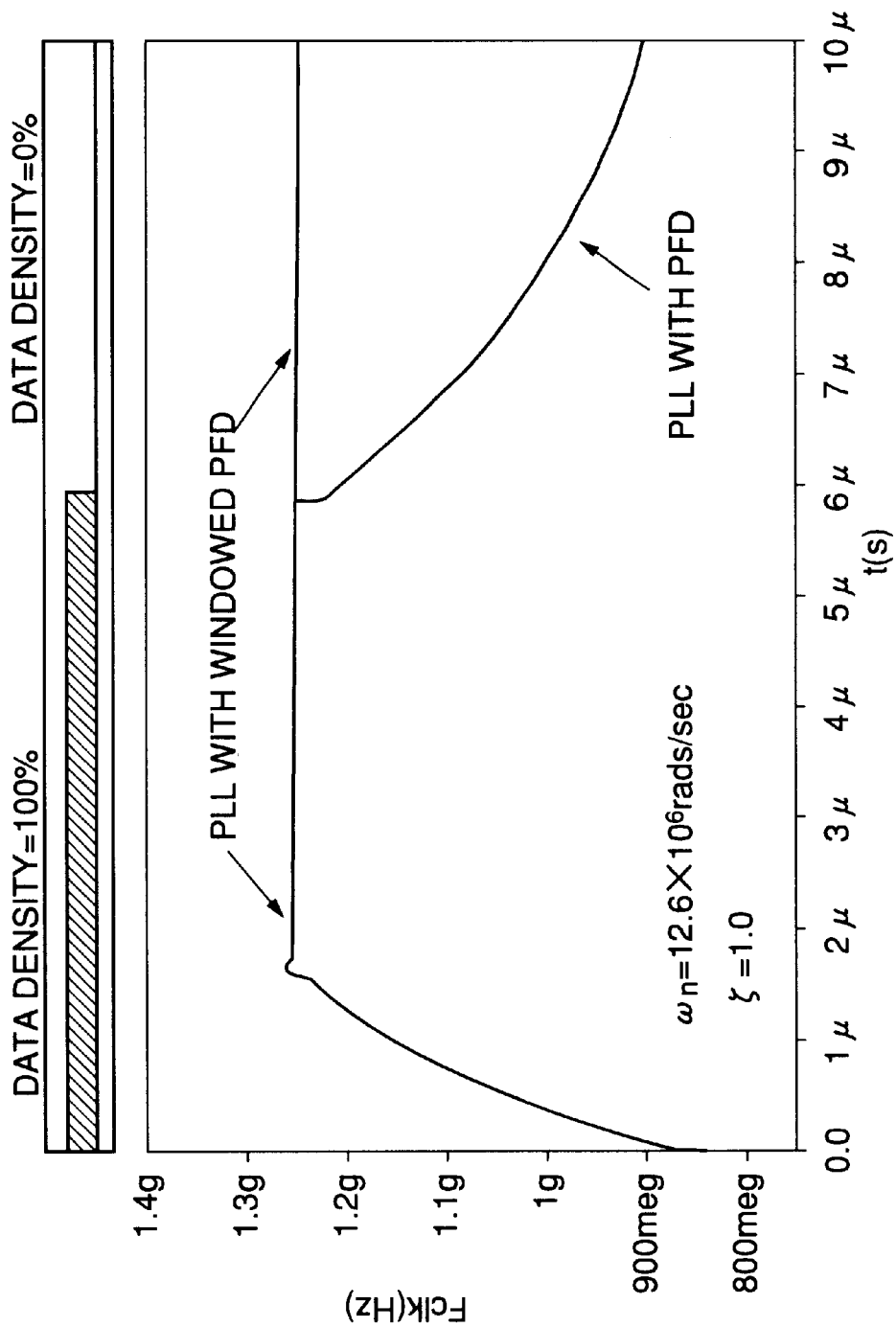
FIG. 14 is a graph illustrating simulation results of the data and clock recovery PLL circuit of FIG. 12.

A simulation result of the PLL circuit of FIG. 12 is shown in FIG. 14. From a study about FIG. 14, it is easy understood that the high impedance of the CP1 and CP2 allows the Windowed PFD based PLL (unlike the Gilbert Multiplier based PLL of FIG. 1) to maintain stable lock for hundreds of consecutive identical bits without the clock time Fclk drooping with time. This simulation result was verified using a mixed mode behavioral simulator, SABER™ on a work station. A data transmission rate of 1.25 Gbps is assumed. Device parameters are based on a L=0.35 µm epitaxial-less BICMOS process, $f_T$=20 GHz at Vcc=1V. Natural frequency $\omega_n$=12.6×10$^6$ rads/sec and damping factor $\zeta$=1.0 are assumed. Notice that a PFD based PLL circuit which doesn't use any window signal quickly loses lock when the data density goes to zero (t>6 µs) as it interprets missing data pulses as drops in input frequency.

Turning back to FIGS. 12 and 13 again, the multiplexers 1110 and 1111 are placed between the VCO 1109 and the phase frequency detectors 1104 and 1105, respectively. The multiplexers 1110 and 1111 produce the feedback signals 1205A and 1205B, respectively. The window signals 1204A and 1204B are supplied to the select input terminals of multiplexers 1110 and 1111, respectively. The multiplexers 1110 and 1111 operates to maintains the phase locked state by guaranteeing that the number of transition edges in the feedback signals 1205A and 1205B equal that of the delayed input signals 1201A and 1201B.

The MUX1 has A and B input terminals, select input SEL and an output terminal F. The A input terminal of the MUX1 is supplied with a digital logic level 1211 of "0". The B input terminal of the MUX1 is supplied with the VCO clock signal 1202. The select terminal is supplied with the window signal 1204A. The MUX1 determine whether the clock signal 1202 or the digital logic level 1211 is fed back to the PFD1 as the feedback signal 1205A in response to the window signal 1204A.

When the DTD1 detects a data transition ("0" to "1") in the input data signal 1200A, the window signal 1204A goes high (i.e. window open) for exactly one data bit. In this case, the MUX1 selects the VCO clock signal 1202 and supplies it to the PFD1 as the feedback signal 1205A. Then, the PFD1 compares the phase of the delayed input data 1201A with that of the feedback signal 1205A. If the rising edge of the delayed input signal 1201A occurs before (or after) the rising edge of the feedback signal 1205A, the delayed input signal 1201A is considered to be leading (or lagging) the feedback signal 1205A. Then, the PFD1 generates an UP (or Down) output pulse 1206A (or 1207A) and subsequently supplies it to the charge pump CP1.

In contrast, when the DTD1 detects no data transition (consecutive string of ONEs or ZEROs) in input data 1200A, the window signal 1204A goes low (i.e. window closed). The MUX2 selects the digital logic level of "0" as the feedback signal 1205A in response to the window signal 1204A.

Similarly, the M has A and B input terminals, select input SEL and an output terminal F. The A input terminal of the MUX2 is supplied with a digital logic level 1211 of "0". The B input terminal of the MUX2 is supplied with the VCO clock signal 1202. The select terminal SEL is supplied with the window signal 1204B. The MUX2 determine whether the clock signal 1202 or the digital logic level 1211 is fed beck to the PFD2 as the feedback signal 1205B in response to the window signal 1204B.

When the DTD2 detects a data transition ("0" to "1") in the delayed input signal 1201B, the window signal 1204B goes high (i.e. window open) for exactly one data bit. In this case, the MUX2 selects the VCO clock signal 1202 in response to the window signal 1204B. Then, the PFD2 compares the phase of the delayed input data 1201B and that of the clock signal 1202. If the rising edge of the delayed input signal 1201B occurs before (or after) the rising edge of the clock signal 1202, the delayed input signal 1201B is considered to be leading (or lagging) 1205B. The PFD2 generates an UP (Down) output pulse 1206B (1207B) and supplies it to the charge pump CP2.

In contrast, when the DTD2 detects no data transition (consecutive string of ONEs or ZEROs) in input data 1200B, window signal 1204B goes low (window closed). In this case, the MUX2 selects the digital logic level of "0" instead of the clock signal 1202 as the feedback signal 1205B in response to the window signal 1204B.

When no data transition is detected in input data 1200A and 1200B, no phase comparison is made in either PFD1 or PFD2 and the PLL circuit remains in the hold mode until the next data bit is detected. Consequently, the PLL circuit can maintain stable lock for a long succession of consecutive identical bits (ONEs or ZEROs).

The simulation result shown in FIG. 14 also illustrates that the circuit acquires the correct frequency of Fclk=1.25 GHz during data preamble (data density=100%) even when the PLL's free-running frequency equals 800 MHz. It was already shown in FIG. 5 that a Gilbert Multiplier based PLL circuit was not able to pull-in for the exact same free-running frequency. Therefore, it can be concluded that the PLL circuit does indeed guarantee pull-in.

Figure 15:
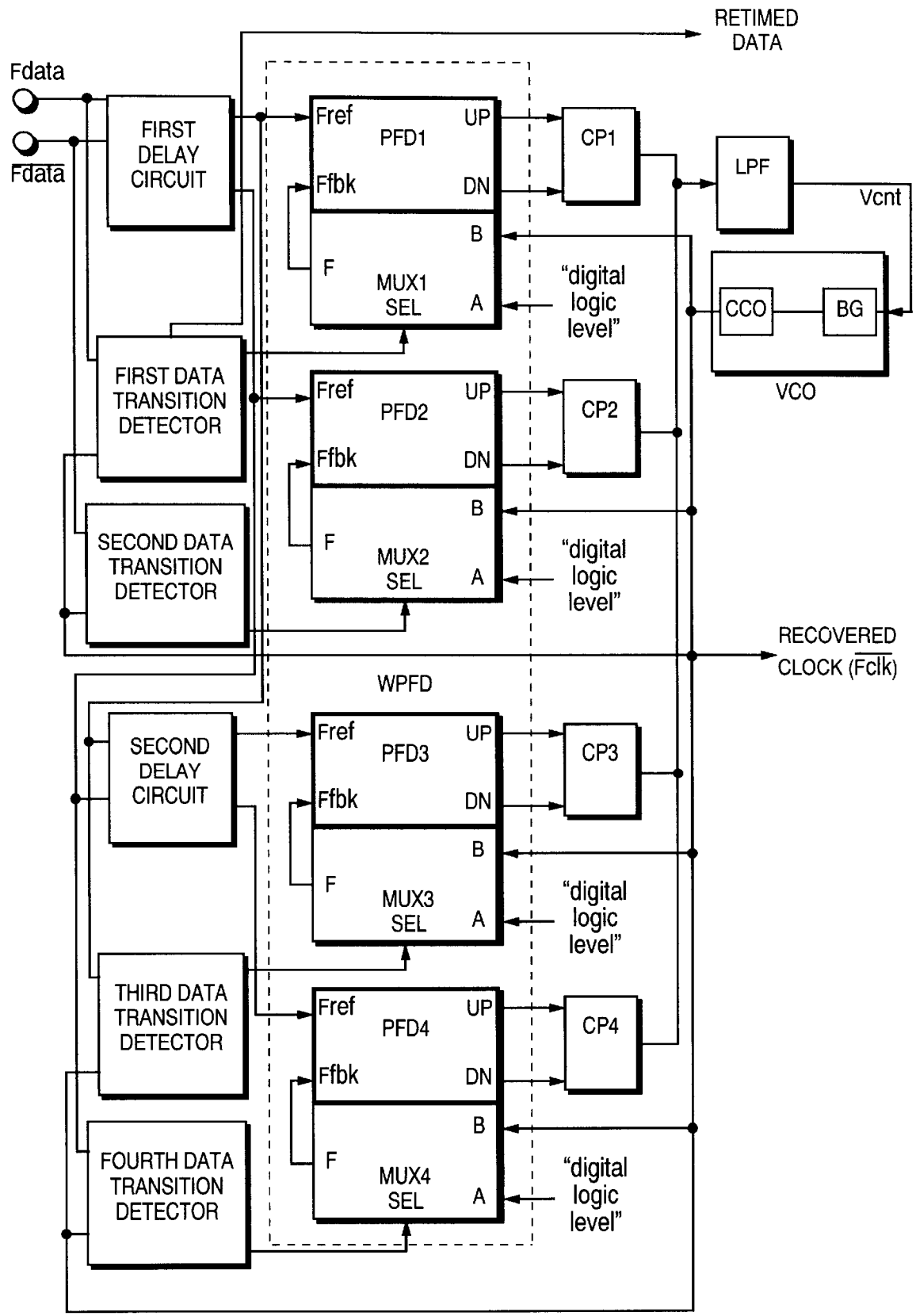
FIG. 15 is a block diagram of a data and clock recovery PLL circuit according to a third example of this invention.

Referring to FIG. 15, a third example is described below.

In FIG. 15, a PLL circuit has first and second delay circuits, first through fourth phase frequency detectors (PDF1–PDF4), first through charge pump circuits (CP1–CP4), a loop filter, a VCO, and first through fourth multiplexers. In the PLL circuit, interleaving of phase frequency comparators, multiplexers and charge pumps is employed to achieve high frequency operation.

Figure 16:
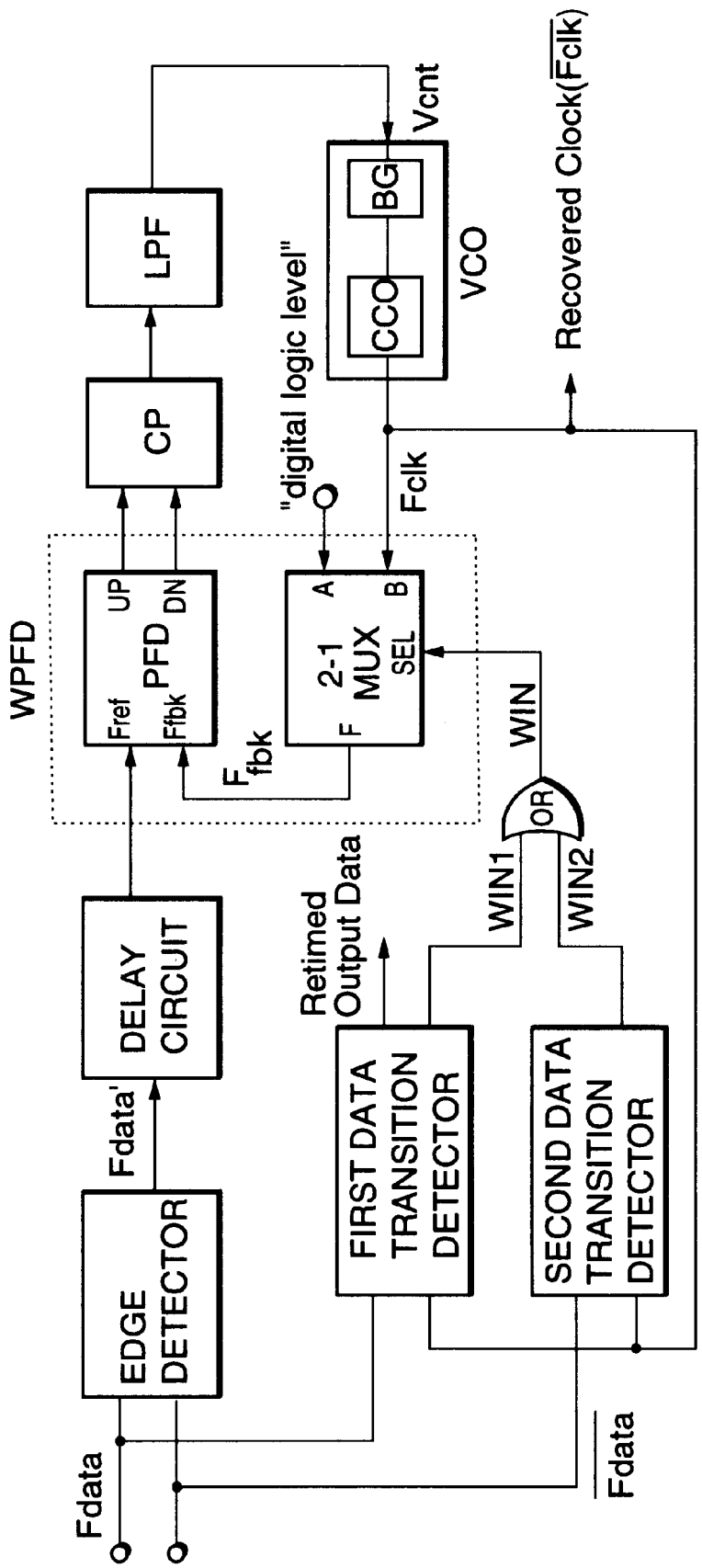
FIG. 16 is a block diagram of a data and clock recovery PLL circuit according to a fourth example of this invention.

Referring to FIG. 16, a fourth example is described below.

In FIG. 16, a data and clock recovery PLL circuit has an edge detector between the input of the PLL circuit and the delay circuit to detect rising and falling edges in the input data signal. A first data transition detector detects the rising edges of the input data signal to produce a first window signal A second data transition detector detects the falling edges of the input data signal to produce a second window signal. An OR gate is connected to the first and the second data transition detectors and the 2-1 multiplexer to supplies the first and the second window signals to the 2-1 multiplexer.

Therefore since both zero-to-one transitions and one-to-zero transitions drive the PLL circuit, this example is recommended for low frequency applications where input data duty-cycle variations are not considered a problem.

Figure 17:
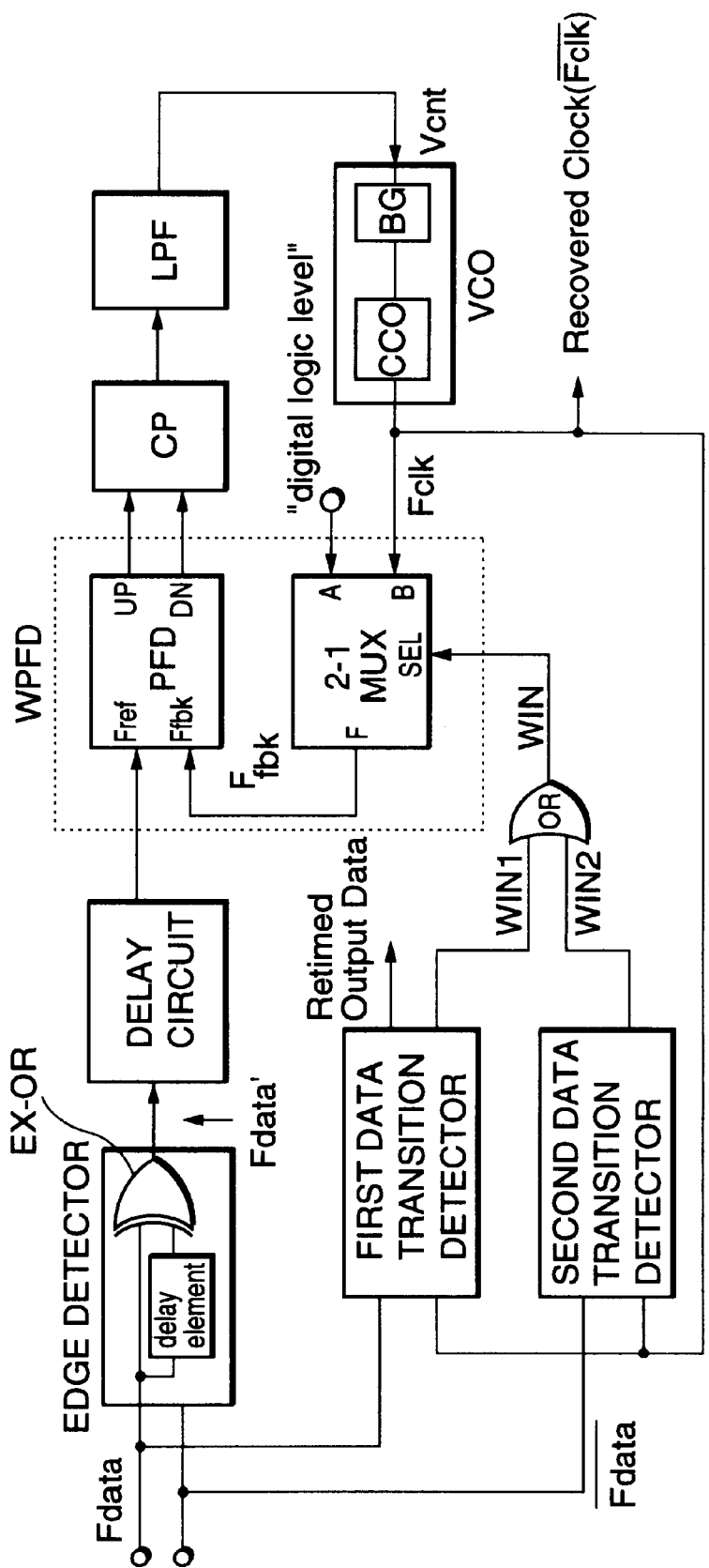
FIG. 17 is a block diagram of an instance of the data and clock recovery PLL circuit of FIG. 16.

The edge detector comprises, for example, an exclusive OR gate and a delay element as shown in FIG. 17.

Figure 18:
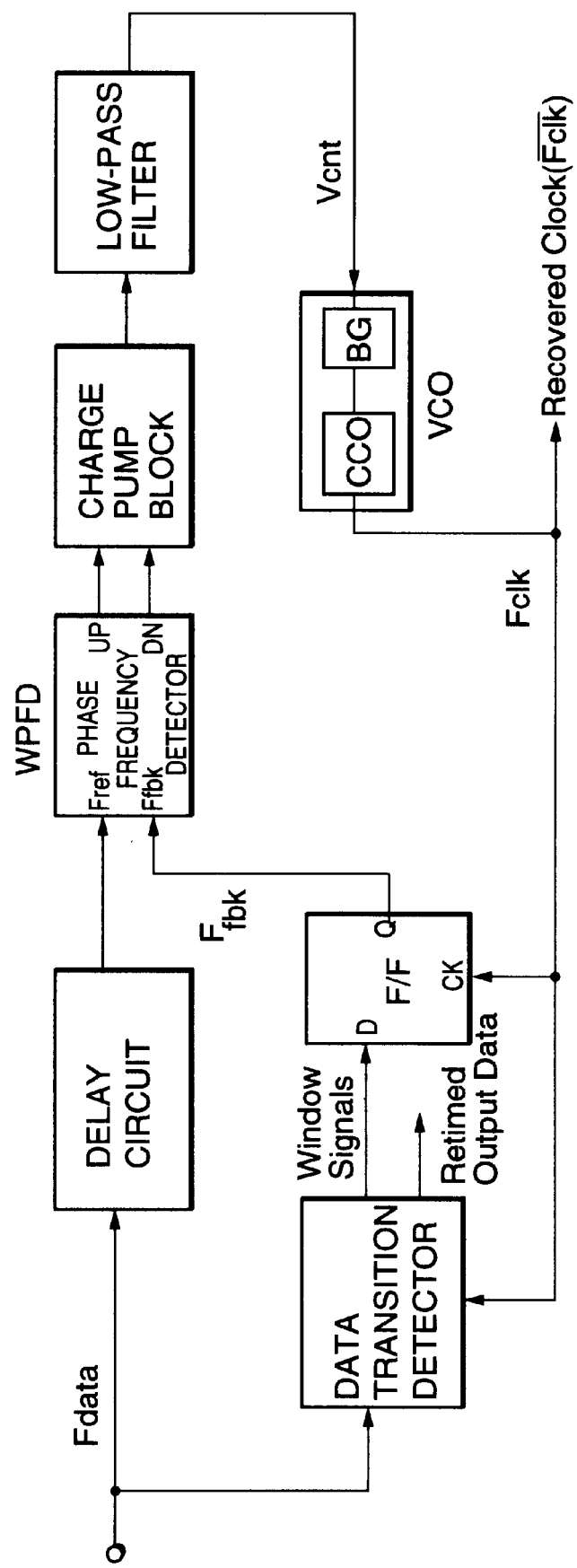

Referring to FIG. 18, an explanation is made about a data and clock recovery circuit according to a fifth example of this invention. The PLL circuit corresponds to the second embodiment shown in FIG. 9.

Figure 19:
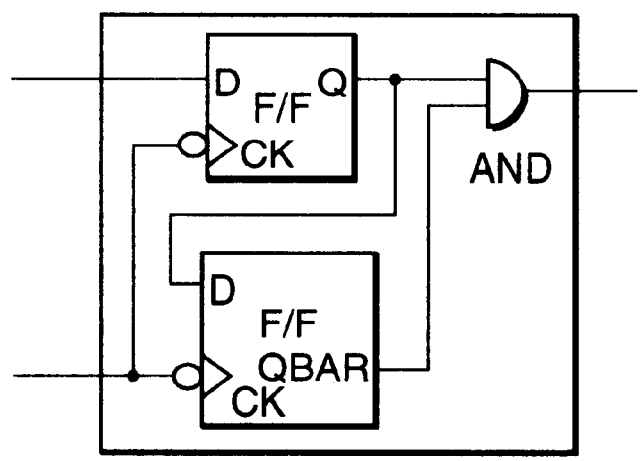
FIG. 19 is a circuit diagram of an example of a data transition detector.

In FIG. 19, the PLL circuit has a delay circuit, a PFD, charge pump circuit, a low-pass filter, a VCO, a DTD, and a D flip-flop. The D flip-flop is a substitute for the 2-1 multiplexer 107 shown in FIG. 10. Namely the PLL circuit does not use a multiplexer block. The D flip-flop delays the window signal sent from the DTD to supply it the PFD. Therefore, the PLL maintains phase lock like that mentioned above.

This example is recommended for applications where a wider pulse feedback signal (than that of the VCO clock signal) is required by the phase comparator block or a level converter placed in the feedback signal path.

Figure 20:
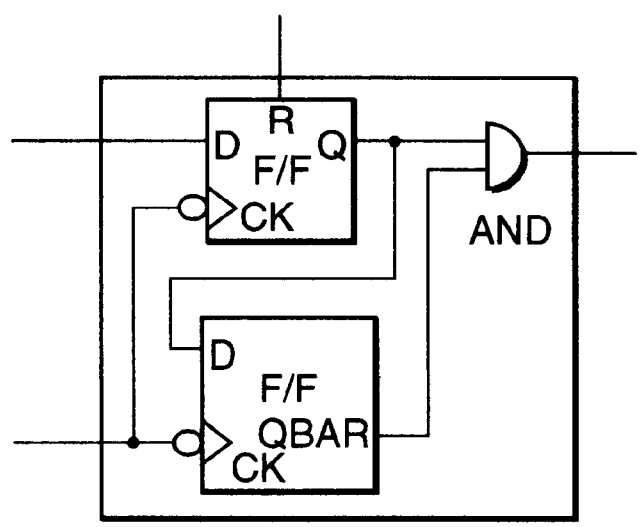
FIG. 20 is a circuit diagram of another example of the data transition detector.
Figure 21:
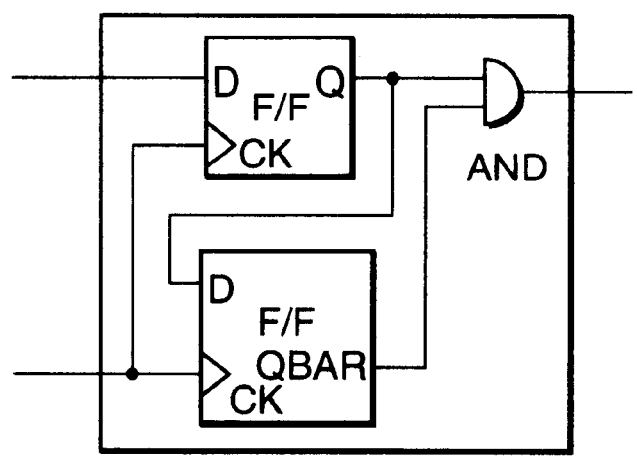
FIG. 21 is a circuit diagram of still another example of the data transition detector.
Figure 22:
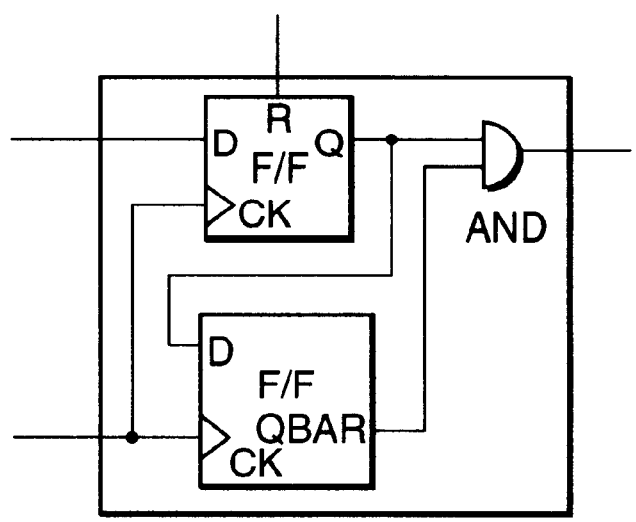
FIG. 22 is a circuit diagram of another example of a data transition detector.

Each of FIGS. 19 through 22 shows a data transition detector which is used for the data and clock recovery PLL circuits described above. The data transition comprises two D flip-flops and an AND gate. The data transition detectors shown in FIGS. 19 and 20 are triggered on the falling edge of the VCO clock signal while those shown in FIGS. 21 and 22 are triggered an the rising edge of the VCO clock signal.

What is claimed is:

1. A data and clock recovery phase locked loop circuit for extracting a clock signal from random input data, said data and clock recovery phase locked loop circuit comprising:
   delay means for delaying the random input data to produce delayed random input data;
   data transition detecting means for detecting transitions of the random input data to produce a window signal;
   phase comparing means connected to said delay means for comparing a phase of the delayed random input data with a phase of a feedback signal to produce a phase compared signal representative of a difference between the phase of the delayed random input data and the phase of a feedback signal;
   charge pump means connected to said phase comparing means for producing output voltage in response to the phase compared signal;
   filter means connected to said charge pump means for filtering the output voltage into DC voltage;
   a voltage controlled oscillator connected to said filter means to generate the clock signal which has a frequency depending on the DC voltage; and
   multiplexer means connected to said voltage controlled oscillator, said data transition detecting means, and said phase comparing means for selecting one from a predetermined logical level and the clock signal to supply a selected signal to said phase comparing means as the feedback signal.

2. A data and clock recovery phase locked loop circuit as claimed in claim 1, wherein said data transition detecting means comprises a single data transition detector which consists of a first D flip-flop having a first input terminal, a first clock terminal, and a first output terminal, a second D flip-flop having a second input terminal, a second clock terminal, and an inverse output terminal, and an AND gate having a third input terminal, a fourth input terminal, and a second output terminal, said first output terminal connected to both second input terminal and third input terminal, said inverse output terminal connected to the fourth input terminal, said first input terminal being used for a data input terminal of said data transition detector, said first clock terminal and said second clock terminal being used for a clock terminal of said data transition detector, and said second input terminal being used for an output terminal of said transition detector.

3. A data and clock recovery phase locked loop circuit as claimed in claim 2, wherein said first D flip-flop has a reset input terminal.

4. A data and clock recovery phase locked loop circuit as claimed in claim 2, wherein said first D flip-flop and said second D flip-flop are clocked by rising edges of the clock signal.

5. A data and clock recovery phase locked loop circuit for extracting a clock signal from random input data, said data and clock recovery phase locked loop circuit comprising:
   delay means for delaying the random input data to produce delayed random input data;
   data transition detecting means for detecting transitions of the random input data to produce a window signal;
   phase comparing means connected to said delay means for comparing a phase of the delayed random input data with a phase of a feedback signal to produce a phase compared signal representative of a difference between the phase of the delayed random input data and the phase of a feedback signal;
   charge pump means connected to said phase comparing means for producing output voltage in response to the phase compared signal;

filter means connected to said charge pump means for filtering the output voltage into DC voltage;

a voltage controlled oscillator connected to said filter means to generate the clock signal which has a frequency depending on the DC voltage; and multiplexer means connected to said voltage controlled oscillator, said data transition detecting means, and said phase comparing means for selecting one from a predetermined logical level and the clock signal to supply a selected signal to said phase comparing means as the feedback signal;

wherein said voltage controlled oscillator comprising a bias generator which generates a bias current according to the DC voltage, and a current controlled oscillator which generates the clock signal in response to the bias current, wherein said bias generator is connected to said delay means to control the delay in said delay means.

6. A data and clock recovery phase locked loop circuit as claimed in claim 5, wherein said phase comparing means comprises a digital phase frequency detector.

7. A data and clock recovery phase locked loop circuit as claimed in claim 6, wherein said delay means produces a delay of between one half and 1.5 times the clock signal.

8. A data and clock recovery phase locked loop circuit as claimed in claim 5, wherein said data transition detecting means is a single data transition detector which has a data input terminal for receiving the random input data, a clock input terminal for receiving the clock signal, and an output terminal for supplying with the window signal, said phase comparing means being a single phase frequency detector which has a first input terminal for receiving the delayed random input data, a second input terminal for the feedback signal, a first output terminal for supplying with the phase compared signal when the random input data leads the feedback signal, and a second output terminal for supplying with the phase compared signal when the random input data lags the feedback signal, said charge pump means being a single charge pump circuit which has an up-side input terminal connected to said first output terminal of said phase frequency detector, a down-side input terminal connected to said second output terminal of said phase frequency detector, and an output terminal connected to said filtering means, said multiplexer means being a single 2-1 multiplexer which has a first input terminal connected to said voltage controlled oscillator, a second input terminal supplied with the predetermined logical level, a select input terminal connected to said output terminal of said data transition detector, and an output terminal connected to said second input terminal of said phase frequency detector.

9. A data and clock recovery phase locked loop circuit as claimed in claim 5, wherein said data and clock recovery phase locked loop circuit further comprises dividing means for dividing the random input data into two divided random input data, phase inverting means for inverting one of the divided random input data into inverted random input data, and a edge detecting means for detecting edges of the random input data according to at least one of the divided random input data and the inverted random input data, said data transition detecting means including a first data transition detector for detecting rising edges or falling edges of the divided random input data to produce a first data transition signal, a second data transition detector for detecting rising edges or falling edges of the inverted random input data to produce a second data transition signal, and an OR gate for producing the window signal from the first data transition signal and the second data transition signal.

10. A data and clock recovery phase locked loop circuit as claimed in claim 9, wherein said edge detecting means comprises a divider for dividing the random input data into two divided random input data, a delaying element for delaying one of the divided random input data into delayed random input data, and an exclusive OR gate connected to said divider and said delaying element to produce an output signal in response to the divided random output data and delayed random input data.

11. A data and clock recovery phase locked loop circuit as claimed in claim 5, wherein said data and clock recovery phase locked loop circuit further comprises dividing means for dividing the random input data into two divided random input data, phase inverting means for inverting one of the divided random input data into inverted random input data, said data transition detecting means having a first data transition detector which has a data input terminal for receiving the random input data, a clock input terminal for receiving the clock signal, and an output terminal for supplying with a first window signal on the basis of the random input data, and a second data transition detector which has a data input terminal for receiving the inverted random input data, a clock input terminal for receiving the clock signal, and an output terminal for supplying with a second window signal on the basis of the inverted random input data, said multiplexer means having a first 2-1 multiplexer which has a first input terminal connected to said voltage controlled oscillator, a second input terminal supplied with the predetermined logical level, a select input terminal connected to said output terminal of said first data transition detector, and an output terminal supplied with a first feedback signal in response to the first window signal, and a second 2-1 multiplexer which has a first input terminal connected to said voltage controlled oscillator, a second input terminal supplied with the predetermined logical level, a select input terminal connected to said output terminal of said second data transition detector, and an output terminal supplied with a second feedback signal in response to the second window signal, said phase comparing means having a first phase frequency detector which has a first input terminal for receiving the delayed random input data, a second input terminal for receiving the first feedback signal, a first output terminal for supplying a first phase compared signal when the delayed random input data leads the first feedback signal, and a second output terminal for supplying the first phase compared signal when the delayed random input data lags the first feedback signal, and a second phase frequency detector which has a first input terminal for receiving the inverted random input data, a second input terminal for receiving the second feedback signal, a first output terminal for supplying a second phase compared signal when the inverted random input data leads the second feedback signal, and a second output terminal for supplying the second phase compared signal when the inverted random input data lags the second feedback signal, said charge pump means having a first charge pump circuit which has an up-side input terminal connected to said first output terminal of said first phase frequency detector, a down-side input terminal connected to said second output terminal of said first phase frequency detector, and an output terminal connected to said filtering means, and a second charge pump circuit which has an up-side input terminal connected to said first output terminal of said second phase frequency detector, a down-side input terminal connected to said second output terminal of said second phase frequency detector, and an output terminal connected to said filtering means.

12. A data and clock recovery phase locked loop circuit as claimed in claim 5, wherein said data and clock recovery phase locked loop circuit further comprises dividing means for dividing the random input data into two divided random input data, phase inverting means for inverting one of the divided random input data into inverted random input data, said delay means having a first delay circuit which delays the random input data and inverted random input data to produce a first delayed random input data and a first delayed inverted random input data, and a second delay circuit which delays the first delayed random input data and the first delayed inverted random input data to produce a second delayed random input data and a second delayed inverted random input data, said data transition detecting means having a first data transition detector which has a data input terminal for receiving the random input data, a clock input terminal for receiving the clock signal, and an output terminal for supplying with a first window signal on the basis of the random input data, a second data transition detector which has a data input terminal for receiving the inverted random input data, a clock input terminal for receiving the clock signal, and an output terminal for supplying with a second window signal on the basis of the inverted random input data, a third data transition detector which has a data input terminal for receiving the first delayed random input data, a clock input terminal for receiving the clock signal, and an output terminal for supplying with a third window signal on the basis of the first delayed random input data, and a fourth data transition detector which has a data input terminal for receiving the first delayed inverted random input data, a clock input terminal for receiving the clock signal, and an output terminal for supplying with a fourth window signal on the basis of the first delayed inverted random input data said multiplexer means having a first 2-1 multiplexer which has a first input terminal connected to said voltage controlled oscillator, a second input terminal supplied with the predetermined logical level, a select input terminal connected to said output terminal of said first data transition detector, and an output terminal supplied with a first feedback signal in response to the first window signal, a second 2-1 multiplexer which has a first input terminal connected to said voltage controlled oscillator, a second input terminal supplied with the predetermined logical level, a select input terminal connected to said output terminal of said second data transition detector, and an output terminal supplied with a second feedback signal in response to the second window signal, a third 2-1 multiplexer which has a first input terminal connected to said voltage controlled oscillator, a second input terminal supplied with the predetermined logical level, a select input terminal connected to said output terminal of said third data transition detector, and an output terminal supplied with a third feedback signal in response to the third window signal, and a fourth 2-1 multiplexer which has a first input terminal connected to said voltage controlled oscillator, a second input terminal supplied with the predetermined logical level, a select input terminal connected to said output terminal of said fourth data transition detector, and an output terminal supplied with a fourth feedback signal in response to the fourth window signal, said phase comparing means having a first phase frequency detector which has a first input terminal for receiving the first delayed random input data, a second input terminal for receiving the first feedback signal, a first output terminal for supplying a first phase compared signal when the first delayed random input data leads the first feedback signal, and a second output terminal for supplying the first phase compared signal when the first delayed random input data lags the first feedback signal, a second phase frequency detector which has a first input terminal for receiving the first delayed inverted random input data, a second input terminal for receiving the second feedback signal, a first output terminal for supplying a second phase compared signal when the first delayed inverted random input data leads the second feedback signal, and a second output terminal for supplying the second phase compared signal when the first delayed inverted random input data lags the second feedback signal, a third phase frequency detector which has a first input terminal for receiving the second delayed random input data, a second input terminal for the third feedback signal, a first output terminal for supplying a third phase compared signal when the second delayed random input data leads the third feedback signal, and a second output terminal for supplying the third phase compared signal when the second delayed random input data lags the third feedback signal, and a fourth phase frequency detector which has a first input terminal for receiving the second delayed inverted random input data, a second input terminal for the fourth feedback signal, a first output terminal for supplying a fourth phase compared signal when the second delayed inverted random input data leads the fourth feedback signal, and a second output terminal for supplying the fourth phase compared signal when the second delayed inverted random input data lags the fourth feedback signal, said charge pump means having a first charge pump circuit which has an up-side input terminal connected to said first output terminal of said first phase frequency detector, a down-side input terminal connected to said second output terminal of said first phase frequency detector, and an output terminal connected to said filtering means, a second charge pump circuit which has an up-side input terminal connected to said first output terminal of said second phase frequency detector, a down-side input terminal connected to said second output terminal of said second phase frequency detector, and an output terminal connected to said filtering means, a third charge pump circuit which has an up-side input terminal connected to said first output terminal of said third phase frequency detector, a down-side input terminal connected to said second output terminal of said third phase frequency detector, and an output terminal connected to said filtering means, and a fourth charge pump circuit which has an up-side input terminal connected to said first output terminal of said fourth phase frequency detector, a down-side input terminal connected to said second output terminal of said fourth phase frequency detector, and an output terminal connected to said filtering means.

13. A data and clock recovery phase locked loop circuit as claimed in claim 5, wherein the predetermined logical level is a logical low level, said data transition detecting means being clocked by falling edges of the clock signal, and said phase comparing means being triggered by rising edges of the delayed random input data.

14. A data and clock recovery phase locked loop circuit as claimed in claim 5, wherein the predetermined logical level is a logical high level, said data transition detecting means being clocked by rising edges of the clock signal, and said phase comparing means being triggered by falling edges of the delayed random input data.

15. A data and clock recovery phase locked loop circuit for extracting a clock signal from random input data, said data and clock recovery phase locked loop circuit comprising:

delay means for delaying the random input data to produce delayed random input data;

data transition detecting means for detecting transitions of the random input data to produce a window signal;

shifting means connected to said data transition detecting means for shifting the window signal and producing a shifted window signal;

phase comparing means connected to said delay means and said shifting means for comparing phase of the delayed random input data with phase of the shifted window signal to produce a phase compared signal representative of a difference between the phase of the delayed random input data and the phase of the shifted window signal;

charge pump means connected to said phase comparing means for producing output voltage in response to the phase compared signal;

filter means connected to said charge pump means for filtering the output voltage into DC voltage; and a voltage controlled oscillator connected to said filter means to generate the clock signal which has a frequency depending on the DC voltage.

16. A data and clock recovery phase locked loop circuit as claimed in claim 15, wherein said data transition detecting means is a single data transition detector which has a data input terminal for receiving the random input data, a clock input terminal for receiving the clock signal, and an output terminal for supplying with the window signal, said shifting means having a single D flip-flop which has a D input terminal for receiving the window signal, a clock input terminal for receiving the clock signal, and a Q output terminal for supplying with the shifted window signal, said phase comparing means being a single phase frequency detector which has a first input terminal for receiving the delayed random input data, a second input terminal for receiving the shifted window signal, a first output terminal for supplying with the phase compared signal when the delayed random input data leads the shifted window signal, and a second output terminal for supplying the phase compared signal when the delayed random input data lags the shifted window signal, and said charge pump means being a single charge pump circuit which has an up-side input terminal connected to said first output terminal of said phase frequency detector, a down-side phase frequency detector, and an output terminal connected to said filtering means.

17. A data and clock recovery phase locked loop circuit as claimed in claim 15, wherein said data transition detecting means is clocked by rising edges or falling edges, said shifting means being clocked by falling edges or rising edes.

18. A data and clock recovery phase locked loop circuit for extracting a clock signal from random input data, said data and clock recovery phase locked loop circuit comprising:

delay means for delaying the random input data to produce delayed random input data;

data transition detecting means for detecting transitions of the random input data to produce a window signal;

phase comparing means connected to said delay means for comparing a phase of the delayed random input data with a phase of a feedback signal to produce a phase compared signal representative of a difference between the phase of the delayed random input data and the phase of a feedback signal;

charge pump means connected to said phase comparing means for producing output voltage in response to the phase compared signal;

filter means connected to said charge pump means for filtering the output voltage into DC voltage;

a voltage controlled oscillator connected to said filter means to generate the clock signal which has a frequency depending on the DC voltage; and multiplexer means connected to said voltage controlled oscillator, said data transition detecting means, and said phase comparing means for selecting one from a predetermined logical level and the clock signal to supply a selected signal to said phase comparing means as the feedback signal;

wherein said data transition detecting means comprises a single data transition detector which consists of a first D flip-flop having a first input terminal, a first inverse clock terminal, and a first output terminal, a second D flip-flop having a second input terminal, a second inverse clock terminal, and an inverse output terminal, and an AND gate having a third input terminal, a fourth input terminal, and a second output terminal, said first output terminal connected to both said second input terminal and said third input terminal, said inverse output terminal connected to said fourth input terminal, said first input terminal being used for a data input terminal of said data transition detector, said first inverse clock terminal and said second inverse clock terminal being used for a clock terminal of said data transition detector, and said second input terminal being used for an output terminal of said transition detector.

19. A data and clock recovery phase locked loop circuit as claimed in claim 18, wherein said first D flip-flop has a reset input terminal.

20. A data and clock recovery phase locked loop circuit as claimed in claim 18, wherein said first D flip-flop and said second D flip-flop are clocked by falling edges of the clock signal.

* * * * *